United States Patent
Jin et al.

(10) Patent No.: US 9,894,301 B2
(45) Date of Patent: Feb. 13, 2018

(54) CMOS IMAGE SENSORS WITH PHOTOGATE STRUCTURES AND SENSING TRANSISTORS, OPERATION METHODS THEREOF, AND IMAGE PROCESSING SYSTEMS INCLUDING THE SAME

(71) Applicants: Young Gu Jin, Osan-si (KR); Min Ho Kim, Seongnam-si (KR); Tae Chan Kim, Yongin-si (KR); Dong Ki Min, Seoul (KR); Sang Chul Sul, Suwon-si (KR); Tae Seok Oh, Seoul (KR); Kwang Hyun Lee, Seongnam-si (KR); Tae Yon Lee, Seoul (KR); Ju Hwan Jung, Seoul (KR)

(72) Inventors: Young Gu Jin, Osan-si (KR); Min Ho Kim, Seongnam-si (KR); Tae Chan Kim, Yongin-si (KR); Dong Ki Min, Seoul (KR); Sang Chul Sul, Suwon-si (KR); Tae Seok Oh, Seoul (KR); Kwang Hyun Lee, Seongnam-si (KR); Tae Yon Lee, Seoul (KR); Ju Hwan Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 296 days.

(21) Appl. No.: 14/877,539

(22) Filed: Oct. 7, 2015

(65) Prior Publication Data
US 2016/0028977 A1 Jan. 28, 2016

Related U.S. Application Data

(63) Continuation of application No. 14/052,024, filed on Oct. 11, 2013, now abandoned.

(60) Provisional application No. 61/713,175, filed on Oct. 12, 2012.

(30) Foreign Application Priority Data

Aug. 27, 2013 (KR) ........................ 10-2013-0101728

(51) Int. Cl.
*H01L 27/00* (2006.01)
*H04N 5/363* (2011.01)
(Continued)

(52) U.S. Cl.
CPC ......... *H04N 5/363* (2013.01); *H01L 27/1461* (2013.01); *H01L 27/14612* (2013.01);
(Continued)

(58) Field of Classification Search
CPC ......... H01L 27/14601; H01L 27/14612; H01L 27/14641; H01L 27/14643
(Continued)

(56) References Cited

U.S. PATENT DOCUMENTS 6,313,455 B1   11/2001   Afghahi
7,023,503 B2   4/2006    den Boer
(Continued)

FOREIGN PATENT DOCUMENTS

JP   2009-147056 A   7/2009
KR   10-0448986 B1   9/2004
(Continued)

*Primary Examiner* — Kevin Pyo
(74) *Attorney, Agent, or Firm* — Harness, Dickey & Pierce, P.L.C.

(57) ABSTRACT

ACMOS image sensor includes a pixel array having a plurality of pixels. Each of the plurality of pixels includes: a photogate structure configured to be controlled based on a first gate voltage; and a sensing transistor including a charge pocket region formed in a substrate region, the sensing transistor being configured to be controlled based on a second gate voltage. Based on the first gate voltage, the photogate structure is configured to integrate charges generated in response to light incident on the substrate region. The sensing transistor is configured to adjust at least one of a threshold voltage of the sensing transistor and a current flow in the sensing transistor according to charges transferred from the photogate structure to the charge pocket region based on a difference between the first gate voltage and the second gate voltage.

28 Claims, 44 Drawing Sheets

(51) Int. Cl.
*H01L 27/146* (2006.01)
*H04N 5/3745* (2011.01)
*H04N 5/374* (2011.01)
*H04N 5/378* (2011.01)

(52) U.S. Cl.
CPC .. *H01L 27/14614* (2013.01); *H01L 27/14643* (2013.01); *H04N 5/374* (2013.01); *H04N 5/378* (2013.01); *H04N 5/3742* (2013.01); *H04N 5/3745* (2013.01)

(58) Field of Classification Search
USPC .......... 250/208.1, 214.1; 257/292, 294, 432, 257/435
See application file for complete search history.

(56) References Cited

U.S. PATENT DOCUMENTS

| | | | |
|---|---|---|---|
| 7,057,150 B2 | 6/2006 | Zarnowski et al. | |
| 7,365,409 B2 | 4/2008 | Fossum | |
| 7,687,755 B2 | 3/2010 | Bae et al. | |
| 7,924,332 B2 | 4/2011 | Gruev et al. | |
| 7,939,903 B2 | 5/2011 | Hsu et al. | |
| 8,013,365 B2 | 9/2011 | Ko et al. | |
| 8,247,849 B2 | 8/2012 | Fife et al. | |
| 2003/0107663 A1* | 6/2003 | Cheng | H01L 27/14643 348/294 |
| 2004/0041930 A1* | 3/2004 | Chao | H04N 5/3575 348/294 |
| 2010/0182467 A1 | 7/2010 | Lee | |
| 2010/0320515 A1 | 12/2010 | Fossum et al. | |
| 2012/0001056 A1 | 1/2012 | Fife et al. | |
| 2012/0001237 A1 | 1/2012 | Fife et al. | |
| 2012/0056248 A1 | 3/2012 | Fife | |

FOREIGN PATENT DOCUMENTS

| | | |
|---|---|---|
| KR | 20080096131 A | 10/2008 |
| KR | 10-0307929 B1 | 11/2011 |

* cited by examiner

FIG. 6

| Voltage (V) | Vsrc | Vpg | Vsl |
|---|---|---|---|
| RESET | Vreset | 0 | 0 |
| INTEGRATION | 0 | Vint | 0 |
| TRANSFER | 0 | Vtran1 | Vtran2 |
| SELECT/READ | Vdd | Vread1 | Vread2 |

- Vreset < −1.5V
- Vint = 0V or negative voltage (−5~0V)
- Vtran = −3~3V
- Vread = positive voltage (0~3V)
- Vdd = −3~3V
* When SELECT/READ are not performed, Vpg = Vsl = 0V

RESET   INTEGRATION   TRANSFER   SELECT/READ

· Vreset > 1.5V
· Vint = 0V or positive voltage (0~5V)
· Vtran = −3~3V
· Vread = negative voltage (−3~0V)
· Vdd = −3~3V
* When SELECT/READ are not performed, Vpg = Vsl = 0V

FIG. 30

| Voltage (V) | Vsrc | Vpg | Vsl |
|---|---|---|---|
| RESET | Vreset | > 0 | 0 |
| INTEGRATION | 0 | Vint | 0 |
| TRANSFER | 0 | Vtran1 | Vtran2 |
| SELECT/READ | Vdd | Vread1 | Vread2 |

RESET    INTEGRATION    TRANSFER    SELECT/READ

· Vreset < −1.5V

· Vint = 0V or negative voltage (−5~0V)

· Vtran = −3~3V

· Vread = positive voltage (0~3V)

· Vdd = −3~3V

* When SELECT/READ are not performed, Vpg = Vsl = 0V

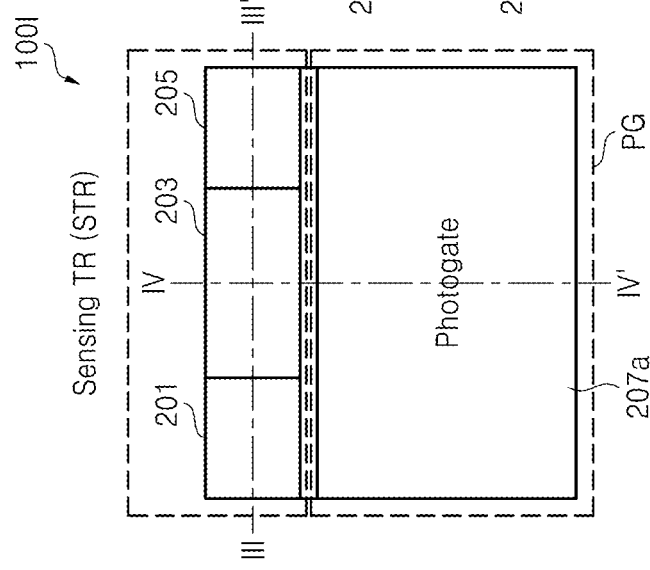
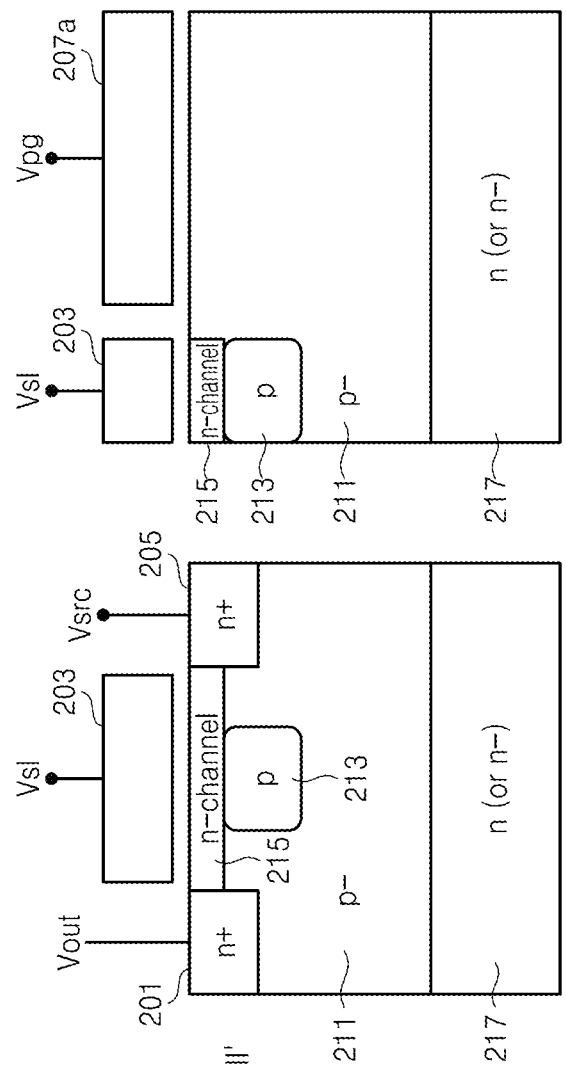
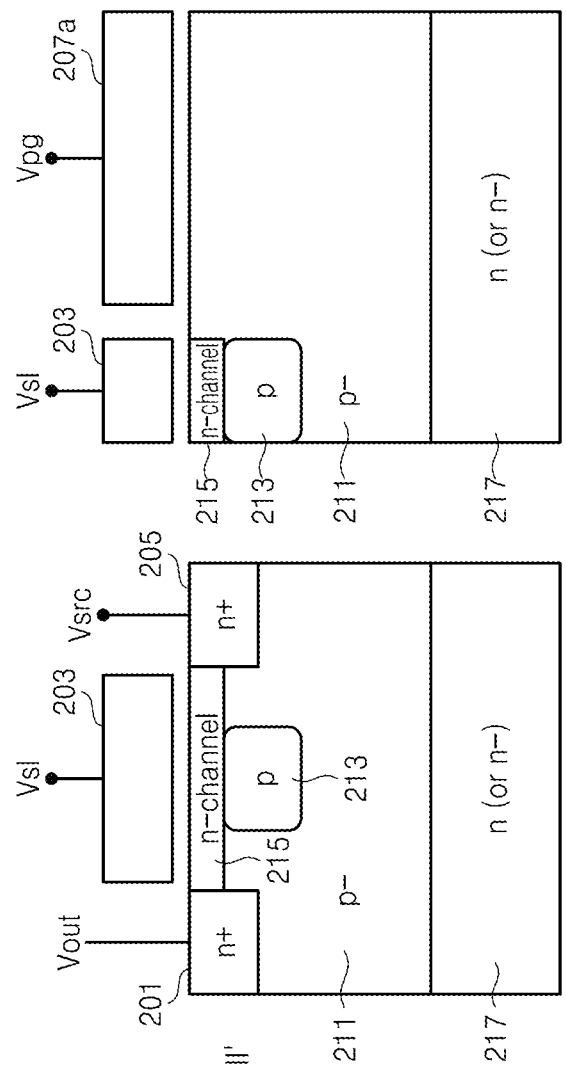

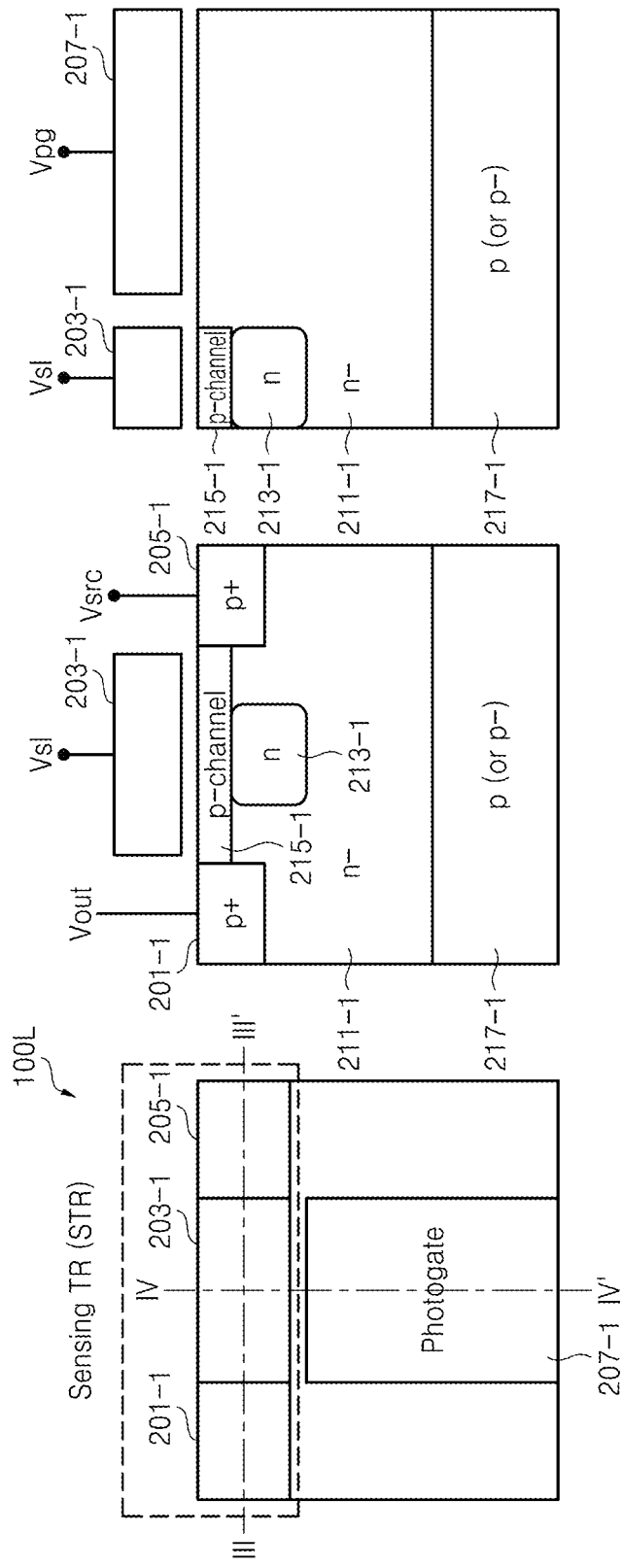

RESET　　　　INTEGRATION　　　TRANSFER　　SELECT/READ

· Vreset > 1.5V
· Vint = 0V or positive voltage (0~5V)
· Vtran = −3~3V
· Vread = negative voltage (−3~0V)
· Vdd = −3~3V
* When SELECT/READ are not performed, Vpg = Vsl = 0V

CMOS IMAGE SENSORS WITH PHOTOGATE STRUCTURES AND SENSING TRANSISTORS, OPERATION METHODS THEREOF, AND IMAGE PROCESSING SYSTEMS INCLUDING THE SAME

CROSS-REFERENCE TO RELATED APPLICATIONS

This application is a continuation of U.S. application Ser. No. 14/052,024, filed on Oct. 11, 2013 which claims priority under 35 U.S.C. § 119(e) to U.S. provisional patent application No. 61/713,175 filed on Oct. 12, 2012, and under 35 U.S.C. § 119(a) to Korean Patent Application No. 10-2013-0101728 filed on Aug. 27, 2013, the entire contents of each of which are hereby incorporated by reference.

BACKGROUND

Field

Example embodiments of inventive concepts relate to a structures of image sensors, and more particularly, to image sensors including photogate structures and sensing transistors, an operation method thereof, and image processing systems including the same.

Description of Conventional Art

An image sensor is a device that converts an optical image into an electrical signal. The image sensor is divided into a charged coupled device(CCD) image sensor and a complementary metal-oxide-semiconductor(CMOS) image sensor.

A CMOS image sensor or a CMOS image sensor chip is a type of active pixel sensor manufactured using a CMOS semiconductor process. The CMOS image sensor chip includes a pixel array including a plurality of pixels. Each of the plurality of pixels includes a photo-electric conversion element generating photo charges in response to incident light, and an additional circuit generating a pixel signal from the photo charges. The additional circuit may include three transistors, four transistors, or five transistors.

SUMMARY

At least some example embodiments provide CMOS image sensors including photogate structures and sensing transistors, which may ensure FWC and reduce kTC noise occurring during a reset operation even while reducing the number of transistors included in an additional circuit. At least some example embodiments also provide operation methods for CMOS image sensors, and image processing systems including CMOS image sensors.

At least one example embodiment provides a complementary-metal-oxide-semiconductor (CMOS) image sensor including: a pixel array having a plurality of pixels. Each of the plurality of pixels includes: a photogate structure configured to be controlled based on a first gate voltage; and a sensing transistor including a charge pocket region formed in a substrate region, the sensing transistor being configured to be controlled based on a second gate voltage. Based on the first gate voltage, the photogate structure is configured to integrate charges generated in response to light incident on the substrate region. The sensing transistor is configured to adjust at least one of a threshold voltage of the sensing transistor and a current flow in the sensing transistor according to charges transferred from the photogate structure to the charge pocket region based on a difference between the first gate voltage and the second gate voltage.

The CMOS image sensor may further include: a readout circuit. The photogate structure may include a photogate transistor having a drain and a source in the substrate region, The photogate transistor may be configured to output a pixel signal corresponding to at least one of the adjusted threshold voltage and the adjusted current flow, and the readout circuit may be configured to output a digital image signal based on the pixel signal.

The photogate transistor and the sensing transistor may share one of the drain and the source, and the photogate transistor and the sensing transistor may be embodied in a planar structure.

The photogate transistor and the sensing transistor may be embodied in a vertical structure and share one of the drain and the source.

The CMOS image sensor may further include: a readout circuit. The sensing transistor may be configured to output a pixel signal corresponding to at least one of the adjusted threshold voltage and the adjusted current flow, and the readout circuit may be configured to output a digital image signal based on the pixel signal.

The photogate structure and the sensing transistor may be arranged in parallel.

The photogate structure may include a photodiode in the substrate region.

Each pixel may further include a reset electrode configured to reset the pixel.

The photogate structure may include: a first gate electrode configured to receive the first gate voltage; a first region in the substrate region, the first region being configured to output a pixel signal corresponding to at least one of the adjusted threshold voltage and the adjusted current flow; and a shared region in the substrate region, the photogate structure and the sensing transistor sharing the shared region. The sensing transistor may include: a second gate electrode configured to receive the second gate voltage; and a second region in the substrate region, the charge pocket region being under the second gate electrode between the shared region and the second region. The sensing transistor may further include a channel region on or over the charge pocket region in the substrate region.

The photogate structure may include: a first gate electrode configured to receive the first gate voltage; a first region in the substrate region, the first region being configured to output a pixel signal corresponding to at least one of the adjusted threshold voltage and the adjusted current flow; and a shared region partially in the substrate region, the photogate structure and the sensing transistor sharing the shared region. The sensing transistor may include: a second gate electrode configured to receive the second gate voltage; and a second region over the shared region, the charge pocket region being between the shared region and the second region.

The photogate structure may include: a first gate electrode configured to receive the first gate voltage; a first region on the substrate region, the first region being configured to output a pixel signal corresponding to at least one of the adjusted threshold voltage and the adjusted current flow; and a shared region partially in the substrate region, the photogate structure and the sensing transistor sharing the shared region. The sensing transistor includes: a second gate electrode configured to receive the second gate voltage; and a second region over the shared region, the charge pocket region being between the shared region and the second region.

The photogate structure may include: a first gate electrode on the substrate region, the first gate electrode being configured to receive the first gate voltage. The sensing transistor may include: a second gate electrode configured to receive the second gate voltage; a first region in the substrate region, the first region being configured to output a pixel signal corresponding to at least one of the adjusted threshold voltage and the adjusted current flow; and a second region in the substrate region, the charge pocket region being under the second gate electrode and between the first region and the second region. The photogate structure may further include a photodiode under the first gate electrode in the substrate region.

Each pixel may further include a reset region in the substrate region, the reset region being connected to a reset electrode configured to reset the pixel.

The CMOS image sensor may further include a row driver configured to: set the first gate voltage to one of a ground voltage and a negative voltage, and set the second gate voltage to the ground voltage to integrate the charges.

The first gate voltage may be greater than the second gate voltage, and the CMOS image sensor may further includes: a row driver configured to supply the first gate voltage to transfer the charges from the photogate structure to the charge pocket region.

The second gate voltage may be greater than or equal to the first gate voltage, and the CMOS image sensor may further include: a row driver configured to supply the second gate voltage. The photogate structure may include a photogate transistor having a drain and a source in the substrate region. The photogate transistor may be configured to output a pixel signal corresponding to at least one of the adjusted threshold voltage and the adjusted current flow through one of the drain and the source.

The second gate voltage may be less than or equal to the first gate voltage, and the CMOS image sensor may further include: a row driver configured to supply the second gate voltage. The sensing transistor may be configured to output a pixel signal corresponding to at least one of the adjusted threshold voltage and the adjusted current flow.

At least one other example embodiment provides an image processing system including: a CMOS image sensor including a pixel array having a plurality of pixels; and a processor configured to control an operation of the CMOS image sensor. Each of the plurality of pixels includes: a photogate structure configured to be controlled based on a first gate voltage; and a sensing transistor including a charge pocket region in a substrate region, the sensing transistor being configured to be controlled based on a second gate voltage. Based on the first gate voltage, the photogate structure is configured to integrate charges generated in response to light incident on the substrate region. The sensing transistor is configured to adjust at least one of a threshold voltage of the sensing transistor and a current flow in the sensing transistor according to charges transferred from the photogate structure to the charge pocket region based on a difference between the first gate voltage and the second gate voltage.

The image processing system may further include a readout circuit. The photogate structure may include a photogate transistor having a drain and a source in the substrate region. The photogate transistor may be configured to output a pixel signal corresponding to at least one of the adjusted threshold voltage and the adjusted current flow. The readout circuit may be configured to output a digital image signal corresponding to the pixel signal.

The image processing system may further include a readout circuit. The sensing transistor may be configured to output a pixel signal corresponding to at least one of the adjusted threshold voltage and the adjusted current flow. The readout circuit may be configured to output a digital image signal corresponding to the pixel signal.

The CMOS image sensor and the processor may be configured to communicate with each other using a MIPI camera serial interface (CSI).

At least one other example embodiment provides method of operating a CMOS image sensor, the method including: integrating charges based on a first gate voltage supplied to a photogate structure, the charges being generated in response to light incident on a substrate region of the photogate structure; transferring the integrated charges to a sensing transistor based on a difference between the first gate voltage and a second gate voltage supplied to the sensing transistor; and adjusting at least one of a threshold voltage of the sensing transistor and a current flow in the sensing transistor in response to charges transferred to the sensing transistor.

The method may further include: outputting a pixel signal corresponding to at least one of the adjusted threshold voltage and the adjusted current flow using one of the photogate structure and the sensing transistor.

At least one other example embodiment provides a pixel of an image sensor, the pixel including: a sensing transistor having a first gate electrode and including a charge pocket region, the first gate electrode being configured to receive a first gate voltage; and a photogate transistor having a second gate electrode configured to receive a second gate voltage, the photogate transistor being configured to transfer accumulated charges to the charge pocket region based on a difference between the first gate voltage and the second gate voltage, the photo charges being accumulated in response to light incident on a substrate portion of the photogate transistor. The sensing transistor and the photogate transistor share one of a source and a drain region.

The charge pocket region may be under the first gate electrode gate electrode between a source region and a drain region of the sensing transistor.

The sensing transistor may be configured such that at least one of a threshold voltage of the sensing transistor and a current flow through the sensing transistor is adjusted according to the charges transferred from the photogate transistor to the charge pocket region.

The photogate transistor and the sensing transistor may be embodied in a vertical structure.

At least one other example embodiment provides an image processing system including: a complementary-metal-oxide-semiconductor (CMOS) image sensor and a processor configured to control operation of the CMOS image sensor. The CMOS image sensor includes a pixel array having a plurality of pixels. Each of the plurality of pixels includes: a sensing transistor having a first gate electrode and including a charge pocket region, the first gate electrode being configured to receive a first gate voltage; and a photogate transistor having a second gate electrode configured to receive a second gate voltage, the photogate transistor being configured to transfer accumulated charges to the charge pocket region based on a difference between the first gate voltage and the second gate voltage, the photocharges being accumulated in response to light incident on a substrate portion of the photogate transistor. The sensing transistor and the photogate transistor share one of a source and a drain region.

BRIEF DESCRIPTION OF THE DRAWINGS

These and/or other aspects and advantages of inventive concepts will become apparent and more readily appreciated from the following description of example embodiments, taken in conjunction with the accompanying drawings of which:

FIG. 6 is a table of voltages for an operation of each image sensor illustrated in FIGS. 1 to 5;

FIG. 30 is a table of voltages for operation of each image sensor illustrated in FIGS. 23 to 29;

FIG. 35 is a plan view of an image sensor including a wide photogate and an NMOS transistor according to still another example embodiment of inventive concepts;

FIG. 36 is a cross-sectional diagram of the image sensor illustrated in FIG. 35 taken along a line III-III';

FIG. 37 is a cross-sectional diagram of the image sensor illustrated in FIG. 35 taken along a line IV-IV';

FIG. 41 is a plan view of an image sensor including a reset electrode, a photogate, and the NMOS transistor according to still another example embodiment of inventive concepts;

FIG. 44 is a plan view of an image sensor including the photogate and the PMOS transistor according to another example embodiment of inventive concepts;

FIG. 45 is a cross-sectional diagram of the image sensor illustrated in FIG. 44 taken along a line III-III';

FIG. 46 is a cross-sectional diagram of the image sensor illustrated in FIG. 44 taken along a line IV-IV';

DETAILED DESCRIPTION

Figure 1:
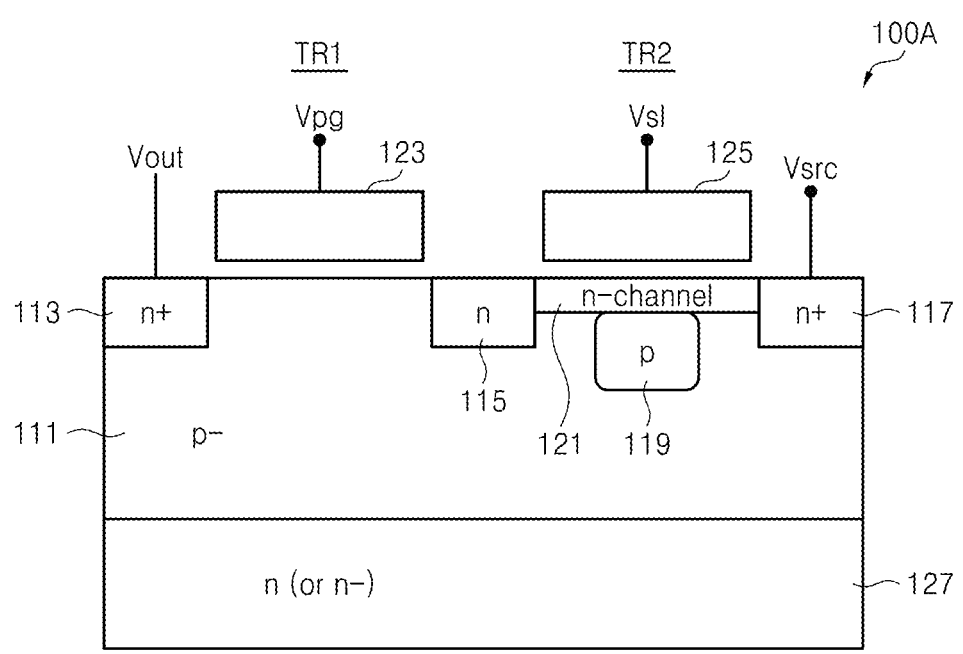
FIG. 1 is a cross-sectional diagram of an image sensor including two NMOS transistors according to an example embodiment of inventive concepts.

Inventive concepts now will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this disclosure will be thorough and complete, and will fully convey the scope to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

A photogate structure includes a photogate or a photogate transistor having a source and a drain.

FIG. 1 is a cross-sectional diagram of an image sensor including two NMOS transistors according to an example embodiment of inventive concepts. Referring to FIG. 1, a pixel 100A of an image sensor includes a first NMOS transistor TR1 and a second NMOS transistor TR2 which share a shared region 115. That is, the pixel 100A may be embodied in two NMOS transistors TR1 and TR2.

The pixel 100A of the image sensor may be embodied in a planar transistor type.

The first NMOS transistor TR1 includes a first region 113 doped with n-type impurities, the shared region 115 doped with n-type impurities, and a first gate electrode 123.

A doping density (or concentration)n+ of the first region 113 may be higher than a doping density (or concentration)n of the shared region 115. Each region 113 and 115 is formed in a first substrate region 111 doped with p-type impurities. For example, each region 113 and 115 may be formed through an ion implantation process.

The second NMOS transistor TR2 includes the shared region 115, a second region 117 doped with n-type impurities, a second gate electrode 125, and a hole pocket region 119 doped with p-type impurities. Each region 117 and 119 is formed in the first substrate region 111. For example, each region 117 and 119 may be formed through the ion implantation process. A doping density n+ of the second region 117 may be higher than a doping density n of the shared region 115.

A doping density p of the hole pocket region 119 according to an example embodiment of a charge pocket region may be higher than a doping density p– of the first substrate region 111.

The hole pocket region 119 may be formed between the shared region 115 and the second region 117, and under the second gate electrode 125 at a given (or alternatively desired or predetermined) depth from the upper surface of the first substrate region 111. Each insulation layer may be formed between each gate electrode 123 and 125 and the upper surface of the first substrate region 111.

An output signal Vout is output through the first region 113, a first gate voltage Vpg is input to the first gate electrode 123, a second gate voltage Vsl is supplied to the second gate electrode 125, and a source voltage Vsrc is supplied to the second region 117. The output signal Vout, that is, a pixel signal, may be a voltage or a current.

According to an example embodiment, an n-channel region 121 may be formed under the upper surface of the first substrate region 111 between the shared region 115 and the second region 117. Here, the n-channel region 121 may be formed through the ion implantation process.

The n-channel region 121 may be formed on or over the hole pocket region 119. The n-channel region 121 may be embodied so as to adjust a threshold voltage of the second NMOS transistor TR2. That is, when the pixel 100A includes the n-channel region 121, a threshold voltage of the second NMOS transistor TR2 decreases.

Accordingly, even if the second gate voltage Vsl supplied to the second gate electrode 125 of the pixel 100A including the n-channel region 121 is lower than a second gate voltage Vsl supplied to the second gate electrode 125 of the pixel 100A which does not include the n-channel region 121, the second NMOS transistor TR2 may operate.

According to another example embodiment, the pixel 100A may further include a second substrate region 127 formed at the lower portion of the first substrate region 111 and doped with n-type impurities.

A doping density n or n– of the second substrate region 127 may be equal to or lower than the doping density n of the shared region 115. The first substrate region 111 and the second substrate region 127 may be included in a silicon substrate or an epitaxial layer.

According to example embodiments, the pixel 100A may include at least one of the n-channel region 121 and the second substrate region 127. According to an example embodiment, a role of the first region 113 and a role of the second region 117 may be changed to each other.

When each gate electrode 123 and 125 is embodied in polysilicon, an image sensor including the pixel 100A may be embodied in a back side illumination(BSI) structure. However, when each gate electrode 123 and 125 is embodied in a transparent electrode material, an image sensor including the pixel 100A may be embodied in a front side illumination(FSI) structure. For example, the transparent electrode material may be embodied in Indium tin oxide (ITO), TiO2, ZnO, or SnO2.

The first NMOS transistor TR1 may be used as a photogate transistor, and the first NMOS transistor TR1 may adjust a charge collection (or charge integration) capability and a full well capacity (FWC) based on the first gate electrode Vpg supplied to the first gate electrode 123.

The second NMOS transistor TR2 may be used as a sensing transistor, and a threshold voltage of the second NMOS transistor TR2 and/or a current flowing in a channel of the second NMOS transistor TR2 may be adjusted according to photocharges transferred from the first NMOS transistor TR1. Here, the first region 113 of the first NMOS transistor TR1 may output an output signal Vout corresponding to a threshold voltage of the adjusted second NMOS transistor TR2 and/or a current flowing in a channel of the adjusted second NMOS transistor TR2.

Operation orders of the pixel 100A may be variously set as follows.

First, the pixel 100A may operate in an order of a reset operation, a charge integration operation, a charge transfer operation, and a read operation.

Second, the pixel 100A may operate in an order of a reset operation, a charge integration operation, a read operation, a charge transfer operation, and a read operation.

Third, the pixel 100A may operate in an order of a reset operation, a read operation, a charge integration operation, a charge transfer operation, and a read operation.

In order to compare pixel signals output from the pixel 100A before and after the charge integration operation, two-time read operations may be performed. Here, an image sensor including the pixel 100A may include correlated double sampling (CDS) circuits which may perform a CDS operation on the pixel signals.

Figure 2:
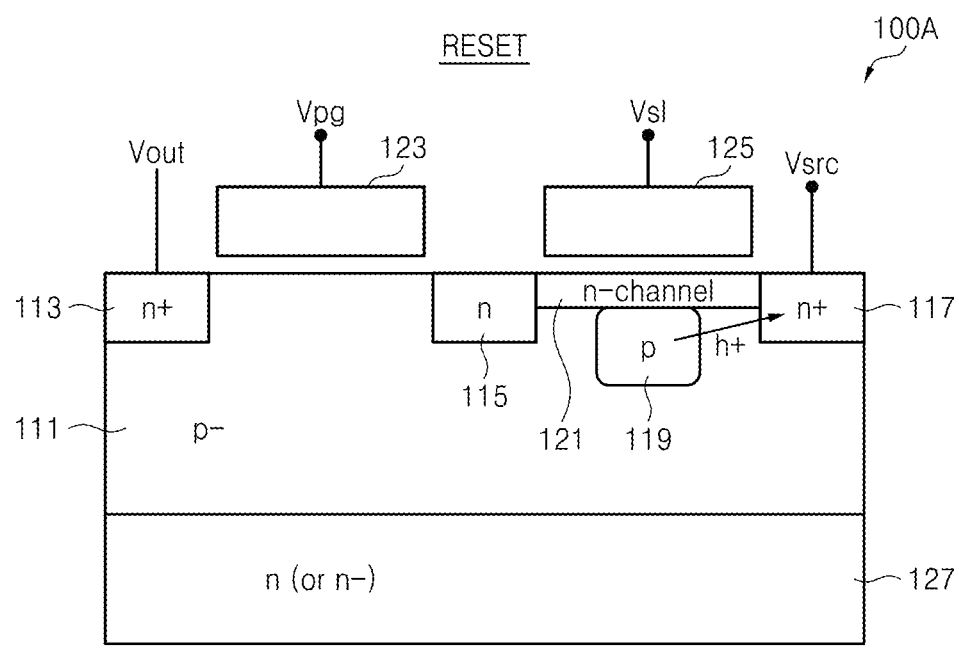
FIG. 2 is a cross-sectional diagram for describing a reset operation of an image sensor illustrated in FIG. 1.

FIG. 2 is a cross-sectional diagram for describing a reset operation of the image sensor illustrated in FIG. 1, FIG. 6 is a table of voltages for operation of each image sensor illustrated in FIGS. 1 to 5, and FIG. 7 is a waveform of a voltage supplied to each region of each image sensor illustrated in FIGS. 1 to 5.

Referring to FIGS. 1, 2, 6 and 7, during a reset operation RESET, holes h+ inside the hole pocket region 119 are removed through the second region 117. Accordingly, during the reset operation RESET, the pixel 100A is initiated. Here, a source voltage Vsrc may be lower than −1.5V as a reset voltage Vreset, and a first gate voltage Vpg and a second gate voltage Vsl may be 0V or a ground voltage.

Figure 3:
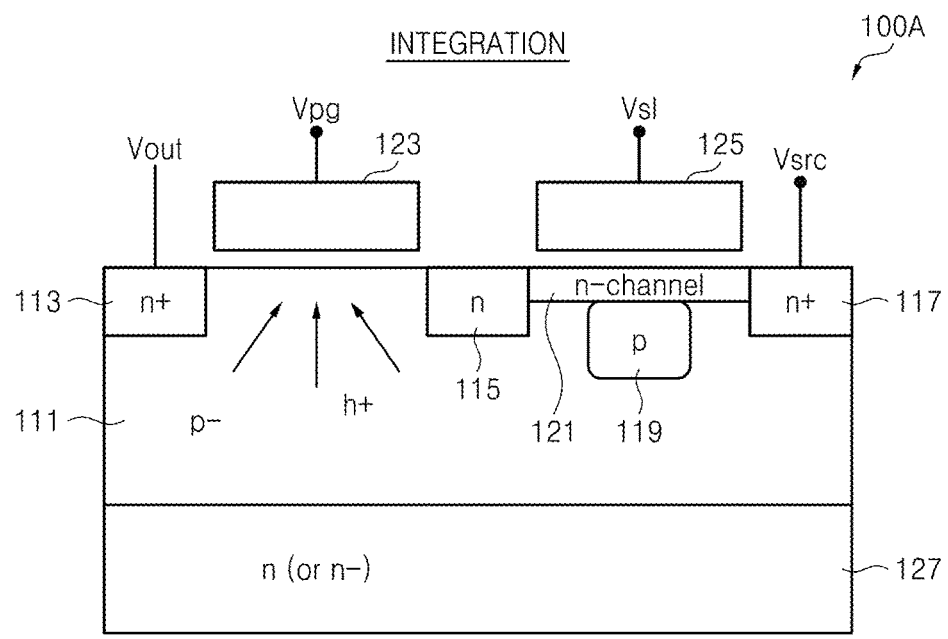
FIG. 3 is a cross-sectional diagram for describing a charge integration operation of the image sensor illustrated in FIG. 1.

FIG. 3 is a cross-sectional diagram for describing a charge integration operation of the image sensor illustrated in FIG. 1.

Referring to FIGS. 1, 3, 6, and 7, during a charge integration operation INTEGRATION, photo charges are generated in the first substrate region 111 by light incident into the first substrate region 111, and holes h+ among the photo charges are integrated or collected in the first substrate region 111 positioned under the first gate electrode 123 based on the first gate voltage Vpg supplied to the first gate electrode 123.

For example, the number of photo charges may be determined according to the intensity of incident light. Here, the source voltage Vsrc and the second gate voltage Vsl are 0V or a ground voltage, respectively, and the first gate voltage Vpg may be 0V or a negative voltage as a charge integration voltage Vint. The negative voltage may be a voltage between −5V and 0V.

Figure 4:
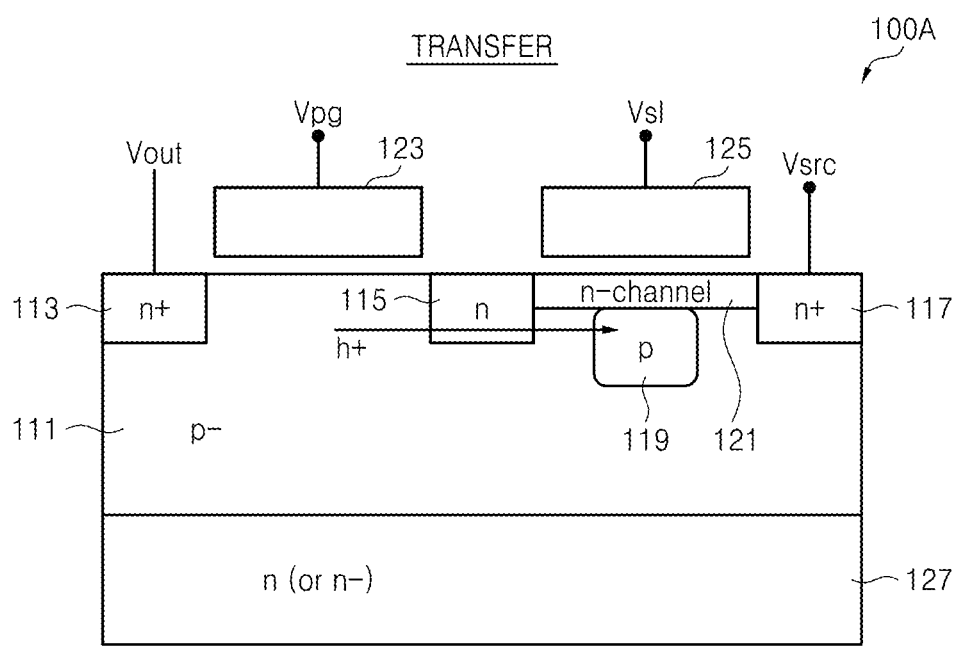
FIG. 4 is a cross-sectional diagram for describing a charge transfer operation of the image sensor illustrated in FIG. 1.

FIG. 4 is a cross-sectional diagram for describing a charge transfer operation of the image sensor illustrated in FIG. 1. Referring to FIGS. 1, 4, 6, and 7, during a charge transfer operation TRANSFER, holes h+ integrated or collected in the first substrate region 111 move (or transfer) to the hole pocket region 119 based on a difference between the first gate voltage Vpg and the second gate voltage Vsl.

Here, the source voltage Vsrc is 0V, the first gate voltage Vpg is a first charge transfer voltage Vtrans1, the second gate voltage Vsl is a second charge transfer voltage Vtran2, and each voltage Vtran1 and Vtran2 may be a voltage between −3V and +3V. Here, the first charge transfer voltage Vtran1 may be higher than the second charge transfer voltage Vtran2.

Figure 5:
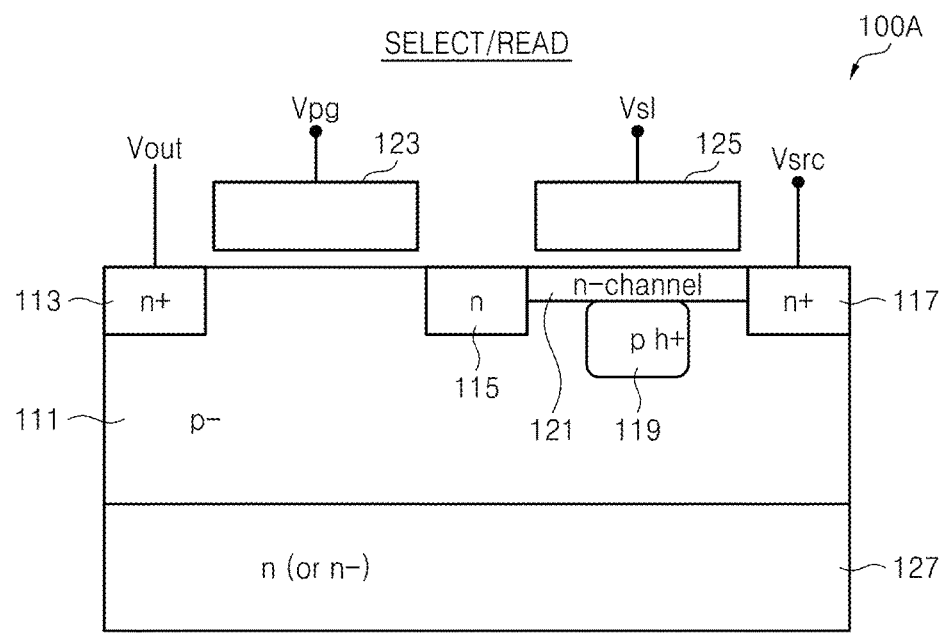
FIG. 5 is a cross-sectional diagram for describing a selection operation and a read operation of the image sensor illustrated in FIG. 1.

FIG. 5 is a cross-sectional diagram for describing a selection operation and a read operation of the image sensor illustrated in FIG. 1.

Referring to FIGS. 1, 5, 6, and 7, during a selection operation or a read operation SELECT/READ, when each of the first gate voltage Vpg and the second gate voltage Vsl is a positive voltage, a threshold voltage of the second NMOS transistor TR2 and/or a current flowing in a channel of the second NMOS transistor TR2 may be adjusted according to the number of holes h+ stored in the hole pocket region 119.

Here, an output signal Vout corresponding to the adjusted threshold voltage of the second NMOS transistor TR2 and/or the adjusted current flowing in a channel of the second NMOS transistor TR2 may be output through a first region 113 of the first NMOS transistor TR1.

Here, the source voltage Vsrc is a voltage between −3V and +3V as an operation voltage Vdd, the first gate voltage Vpg is a first read voltage Vread1, the second gate voltage Vsl is a second read voltage Vread2, and each read voltage Vread1 and Vread2 may be a positive voltage, e.g., a voltage between 0V and +3V. Here, the first read voltage Vread1 may be slightly lower than the second read voltage Vread2. When the selection operation and the read operation SELECT/READ are not performed, the first gate voltage Vpg and the second gate voltage Vsl are 0V, respectively.

Figure 7:
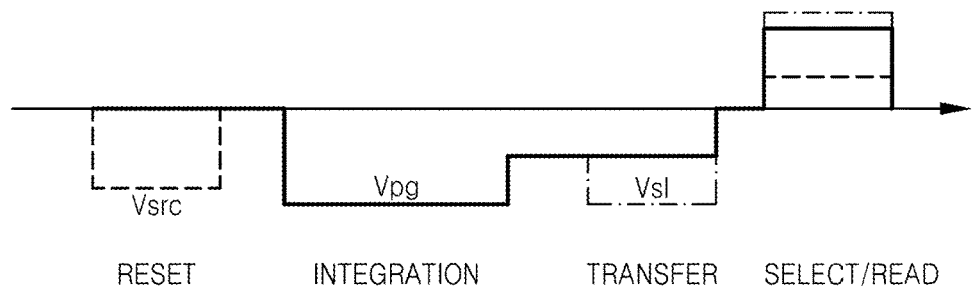
FIG. 7 is a waveform of a voltage supplied to each region of each image sensor illustrated in FIGS. 1 to 5.

Each voltage Vsrc, Vpg, and Vsl and waveforms illustrated in FIGS. 6 and 7 are merely exemplifications for convenience of description, and may be variously changed according to an image sensor design specifications.

Figure 8:
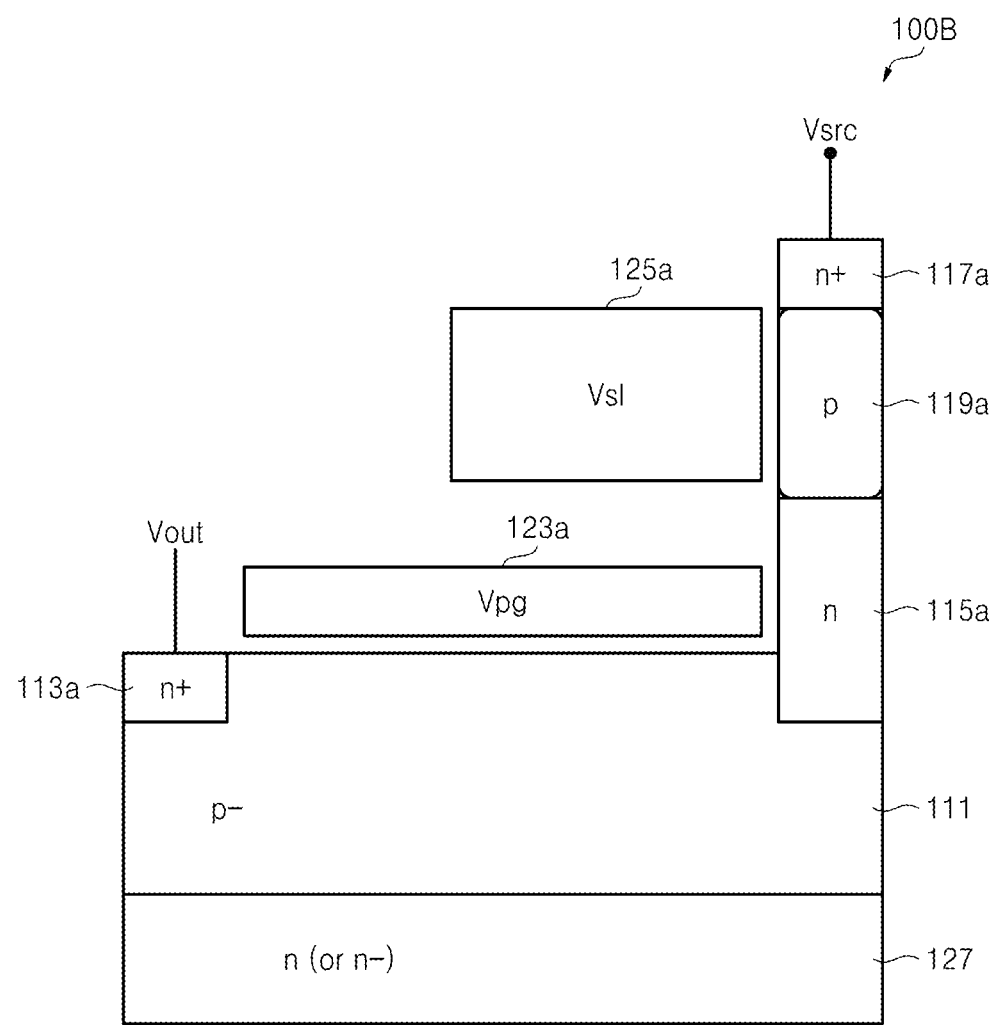
FIG. 8 is a cross-sectional diagram of an image sensor including two NMOS transistors according to another example embodiment of inventive concepts.

FIG. 8 is a cross-sectional diagram of an image sensor including two NMOS transistors according to another example embodiment of inventive concepts. Referring to FIG. 8, a pixel 100B of an image sensor includes a first NMOS transistor and a second NMOS transistor which share a shared region 115a. That is, the pixel 100B may be embodied in two NMOS transistors.

The pixel 100B of the image sensor may be embodied in a vertical transistor type. The first NMOS transistor performing a function of the photogate structure, i.e., the photogate transistor, includes a first region 113a doped with n-type impurities, the shared region 115a doped with n-type impurities, and a first gate electrode 123a receiving a first gate voltage Vpg.

Each region 113a and 115a may be formed in the first substrate region 111 according to the ion implantation process. Here, at least some of the shared region 115a may be formed in the first substrate region 111.

The second NMOS transistor which may perform a function of the sensing transistor includes the shared region 115a, a second region 117a doped with n-type impurities, a second gate electrode 125a receiving the second gate voltage Vsl, and a hole pocket region 119a doped with p-type impurities. Each region 115a, 117a, and 119a may be vertically embodied.

A function and a doping density of each region 113a, 115a, 117a, and 119a in FIG. 8 are substantially the same as a function and a doping density of each region 113, 115, 117, and 119 in FIG. 1.

As described referring to FIG. 1, according to which substance (or material) is used to form each gate electrode 123a and 125a, an image sensor including the pixel 100B may be embodied in a BSI structure or a FSI structure. The pixel 100B may or may not include the second substrate region 127. Although not illustrated in FIG. 8, an n-channel region which may perform the same function as the n-channel region 121 of FIG. 1 may be formed between the shared region 115a and the second region 117a.

An insulation layer may be formed between the first gate electrode 123a and the first substrate region 111, and an insulation layer may be formed between the second gate electrode 125a and the hole pocket region 119a.

When the n-channel region which may perform the same function as the n-channel region 121 of FIG. 1 is formed between the shared region 115a and the second region 117a, an insulation layer may be formed between the second gate electrode 125a and the n-channel region. According to an example embodiment, the n-channel region and the hole pocket region 119a may be in contact with each other or be separated from each other. The pixel 100B having the structure illustrated in FIG. 8 may be embodied according to various CMOS processes.

Figure 9:
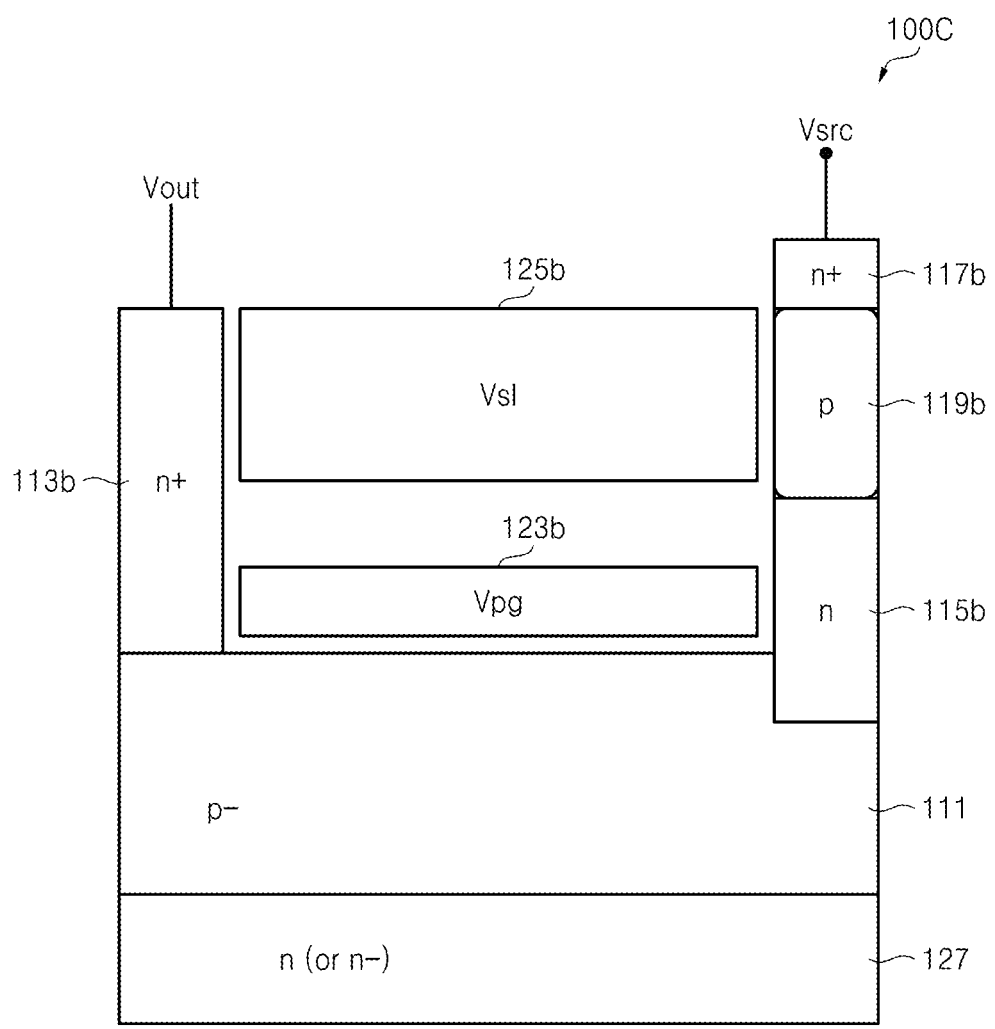
FIG. 9 is a cross-sectional diagram of an image sensor including two NMOS transistors according to still another example embodiment of inventive concepts.

FIG. 9 is a cross-sectional diagram of an image sensor including two NMOS transistors according to still another example embodiment of inventive concepts. Referring to FIG. 9, a pixel 100C of the image sensor includes the first NMOS transistor and the second NMOS transistor which share a shared region 15b. That is, the pixel 100C may be embodied in two NMOS transistors.

The pixel 100C of the image sensor may be embodied in a vertical transistor type.

The first NMOS transistor performing a function of the photogate structure, i.e., the photogate transistor, includes a first region 113b doped with n-type impurities, the shared region 115b doped with n-type impurities, and a first gate electrode 123b receiving a first gate voltage Vpg. The first region 113b may be formed on the first substrate region 111. According to an example embodiment, a portion of the first region 113b may be embodied in the first substrate region 111.

The second NMOS transistor which may perform a function of the sensing transistor includes the shared region 115b, the second region 117b doped with n-type impurities, the second gate electrode 125b receiving the second gate voltage Vsl, and the hole pocket region 119b doped with p-type impurities. At least portion of the shared region 115b may be embodied in the first substrate region 111. Each region 115b, 117b, and 119b may be vertically embodied.

A function and a doping density of each region 113b, 115b, 117b, and 119b of FIG. 9 are substantially the same as the function and the doping density of each region 113, 115, 117, and 119 of FIG. 1.

As described referring to FIG. 1, according to which substance (or material) is used to form each gate electrode 123b and 125b, an image sensor including the pixel 100C may be embodied in a BSI structure or a FSI structure.

The pixel 100C may or may not include the second substrate region 127. Although not illustrated in FIG. 9, an n-channel region which may perform the same function as the n-channel region 121 of FIG. 1 may be formed between the shared region 115b and the second region 117b. An insulation layer may be formed between the first gate electrode 123b and the first substrate region 111, and an insulation layer may be formed between the second gate electrode 125b and the hole pocket region 119b.

When the n-channel region which may perform the same function as the n-channel region 121 of FIG. 1 is formed between the shared region 115b and the second region 117b, an insulation layer may be formed between the second gate electrode 125b and the n-channel region.

The pixel 100C illustrated in FIG. 9 includes a thin body, thereby improving sensing margin and inhibiting leakage current.

Figure 10:
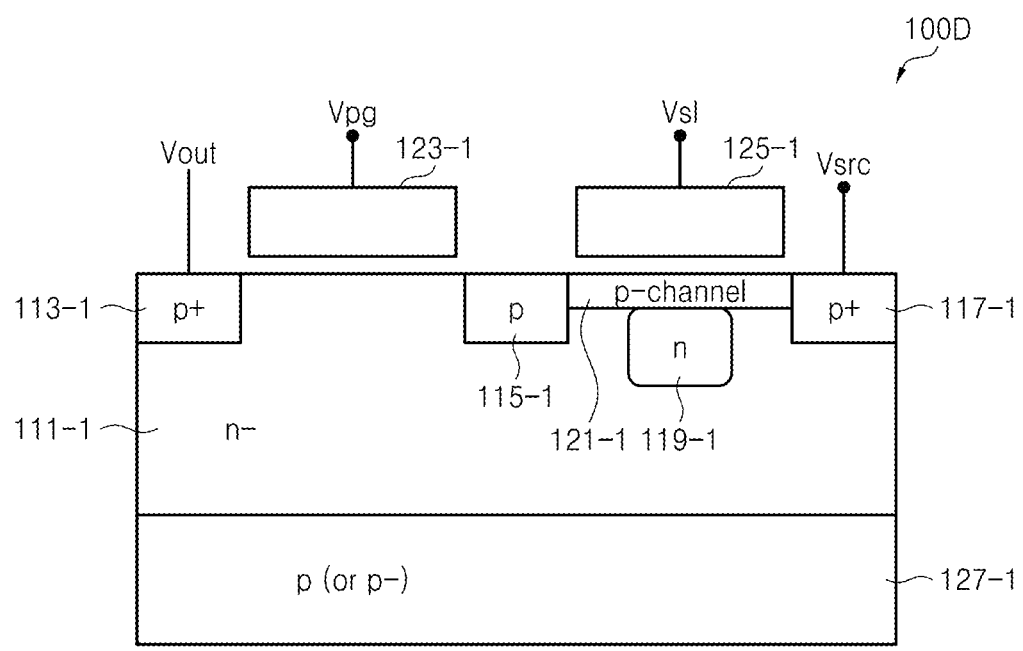
FIG. 10 is a cross-sectional diagram of an image sensor including two PMOS transistors according to still another example embodiment of inventive concepts.

FIG. 10 is a cross-sectional diagram of an image sensor including two PMOS transistors according to still another example embodiment of inventive concepts. Referring to FIGS. 1 and 10, a pixel 100D of the image sensor includes a first PMOS transistor and a second PMOS transistor which share a shared region 115-1. That is, the pixel 100D may be embodied in two PMOS transistors.

The pixel 100D of the image sensor may be embodied in a plan transistor type.

The first PMOS transistor which performs a function of the photogate structure, i.e., the photogate transistor, includes the first region 113-1 doped with p-type impurities, the shared region 115-1 doped with p-type impurities, and the first gate electrode 123-1 receiving the first gate voltage Vpg.

A doping density p+ of the first region 113-1 may be higher than a doping density p of the shared region 115-1. Each region 113-1 and 115-1 is formed in the first substrate region 111-1 doped with n-type impurities. For example, each region 113-1 and 115-1 may be formed through the ion implantation process.

The second PMOS transistor which performs a function of the sensing transistor includes the shared region 115-1, the second region 117-1 doped with p-type impurities, the second gate electrode 125-1 receiving the second gate voltage Vsl, and the electronic pocket region 119-1 doped with n-type impurities. Each pocket region 119 and 119-1 may perform a function of a photo charge pocket region.

Each region 117-1 and 119-1 is formed in the first substrate region 111-1. For example, each region 117-1 and 119-1 may be formed through the ion implantation process. A doping density p+ of the second region 117-1 may be higher than a doping density p of the shared region 115-1. A doping density n of the electronic pocket region 119-1 may be higher than a doping density n− of the first substrate region 111-1.

The electronic pocket region 119-1 may be formed between the shared region 115-1 and the second region 117-1, and under the second gate electrode 125-1 at a given (or alternatively desired or predetermined) depth from the upper surface of the first substrate region 111-1.

Each insulation layer may be formed between each gate electrode 123-1 and 125-1 and the upper surface of the first substrate region 111-1. An output signal Vout is output through the first region 113-1, a first gate voltage Vpg is input to the first gate electrode 123-1, a second gate voltage Vsl is supplied to the second gate electrode 125-1, and a source voltage Vsrc is supplied to the second region 117-1. As described above, the output signal Vout, i.e., a pixel signal, may be a voltage or a current.

According to an example embodiment, a p-channel region 121-1 may be formed under the upper surface of the first substrate region 111-1 between the shared region 115-1 and the second region 117-1. Here, the p-channel region 121-1 may be formed through the ion implantation process.

The p-channel region 121-1 may be formed on or over the electronic pocket region 119-1. The p-channel region 121-1 may be embodied so as to adjust a threshold voltage of the second PMOS transistor. That is, when the pixel 100D includes the p-channel region 121-1, a threshold voltage of the second PMOS transistor decreases.

According to another example embodiment, the pixel 100D may further include a second substrate region 127-1 formed at the lower portion of the first substrate region 111-1 and doped with p-type impurities. A doping density p or p− of the second substrate region 127-1 may be equal to or lower than a doping density p of the shared region 115-1.

The first substrate region 111-1 and the second substrate region 127-1 may be included in a silicon substrate or an epitaxial layer. According to an example embodiment, the pixel 100D may include at least one of the p-channel region 121-1 and the second substrate region 127-1. According to an example embodiment, a role of the first region 113-1 and a role of the second region 117-1 may be changed to each other.

When each gate electrode 123-1 and 125-1 is embodied in a polysilicon, an image sensor including the pixel 100D may be embodied in a BSI structure. However, when each gate electrode 123-1 and 125-1 is embodied in a transparent electrode material, the image sensor including the pixel 100D may be embodied in a FSI structure.

The first PMOS transistor may be embodied in a photogate transistor, and the first PMOS transistor may adjust a charge integration capability and FWC based on a first gate voltage Vpg supplied to the first gate electrode 123-1.

Figure 11:
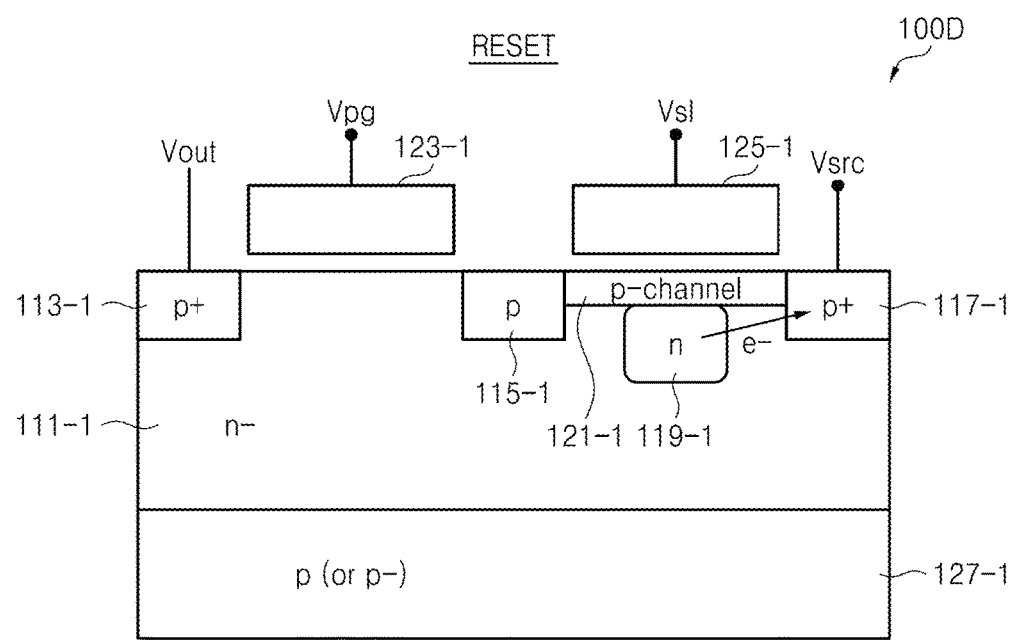
FIG. 11 is a cross-sectional diagram for describing a reset operation of the image sensor illustrated in FIG. 10.
Figure 13:
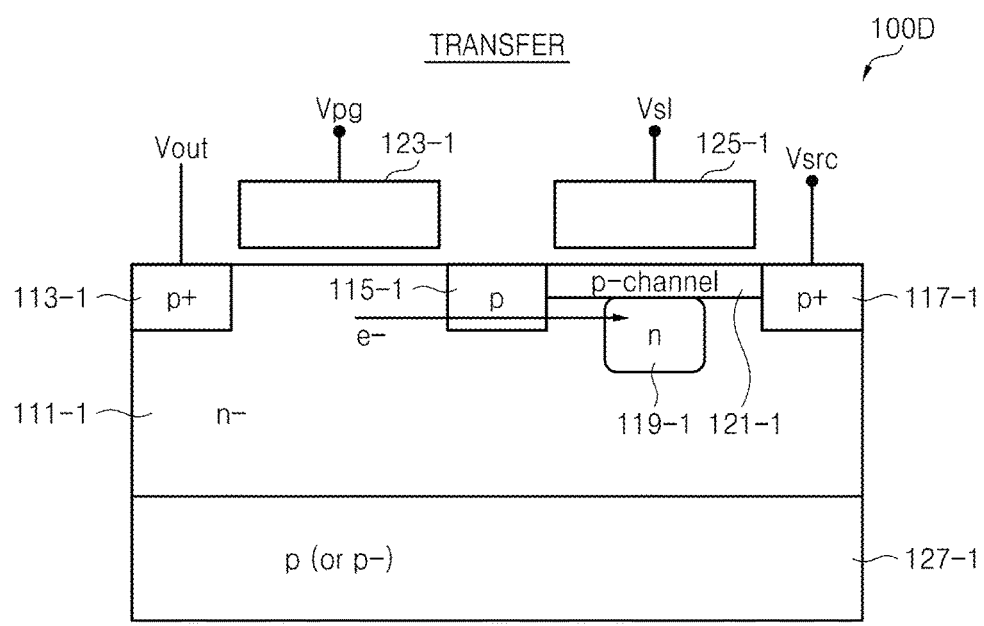
FIG. 13 is a cross-sectional diagram for describing a charge transfer operation of the image sensor illustrated in FIG. 10.
Figure 14:
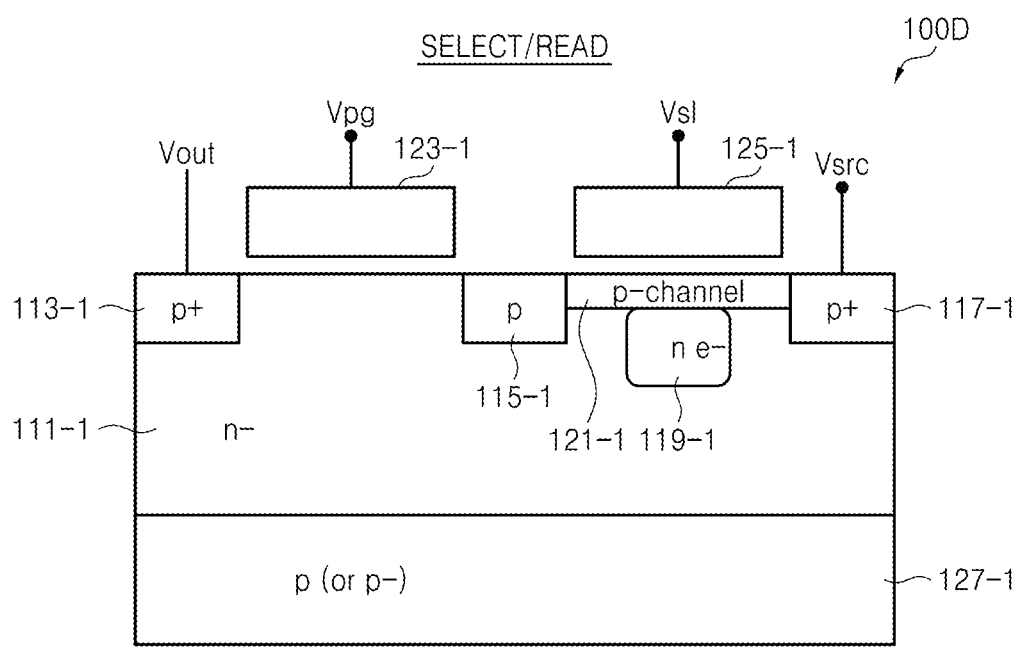
FIG. 14 is a cross-sectional diagram for describing a selection operation and a read operation of the image sensor illustrated in FIG. 10.
Figure 15:
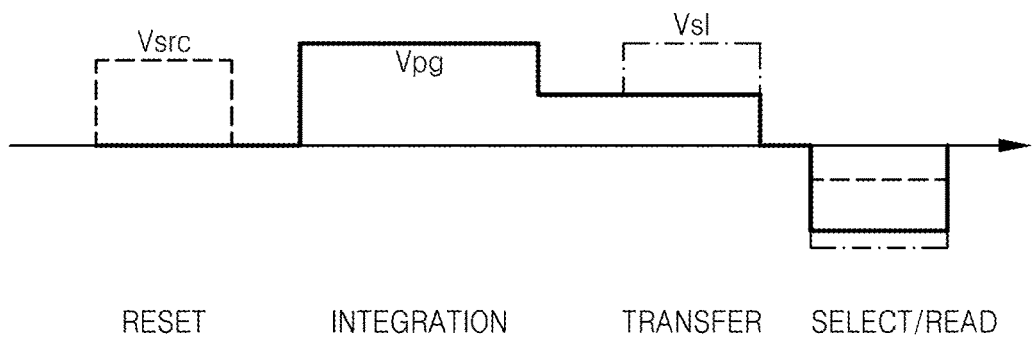
FIG. 15 is a table of voltages for operation of each image sensor illustrated in FIGS. 10 to 14.

FIG. 11 is a cross-sectional diagram for describing a reset operation of the image sensor illustrated in FIG. 10, and FIG. 15 is a table of voltages for operation of each image sensor illustrated in FIGS. 11 to 14. Referring to FIGS. 6, 10, 11, and 15, during a reset operation RESET, electrons e− in the electronic pocket region 119-1 are removed through the second region 117-1. During the reset operation RESET, the pixel 100D is initialized.

Here, the source voltage Vsrc may be higher than 1.5V as a reset voltage Vreset, and the first gate voltage Vpg and the second gate voltage Vsl may be 0V or a ground voltage, respectively.

Figure 12:
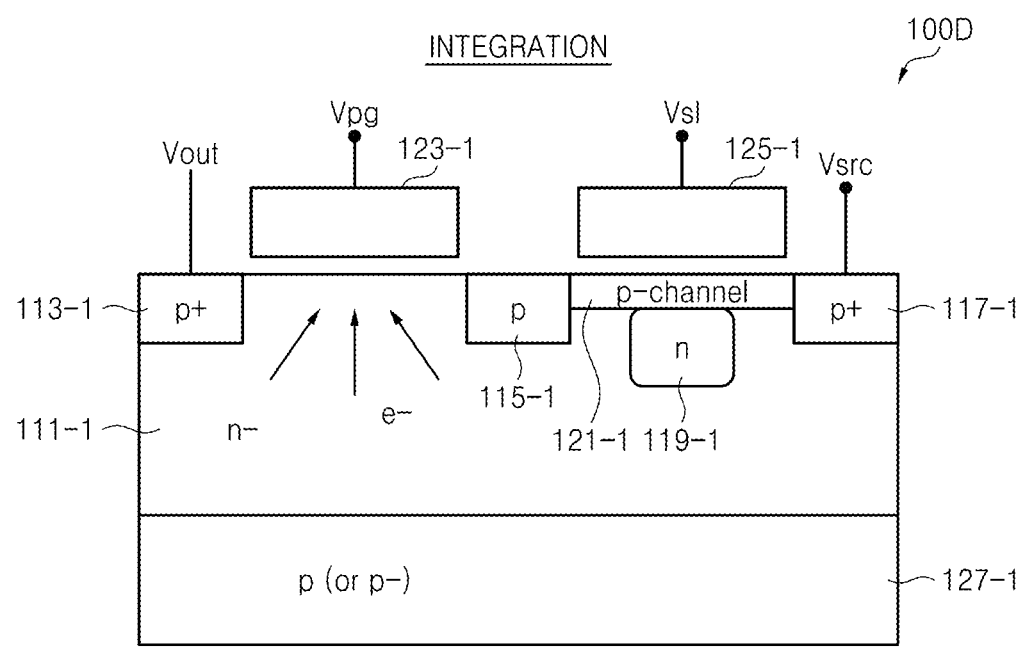
FIG. 12 is a cross-sectional diagram for describing a charge integration operation of the image sensor illustrated in FIG. 10.

FIG. 12 is a cross-sectional diagram for describing a charge integration operation of the image sensor illustrated in FIG. 10. Referring to FIGS. 6, 10, 12, and 15, during a charge integration operation INTEGRATION, photo charges are generated in the first substrate region 111-1 by light incident into the first substrate region 111-1, and electrons e− among the photo charges are integrated or collected in the first substrate region 111-1 positioned under the first gate electrode 123-1 according to the first gate voltage Vpg supplied to the first gate electrode 123-1. For example, the number of photo charges may be determined according to the intensity of incident light.

Here, the source voltage Vsrc and the second gate voltage Vsl are 0V or a ground voltage, respectively, and the first gate voltage Vpg may be 0V or a positive voltage as a charge integration voltage Vint. The positive voltage may be a voltage between 0V and 5V.

FIG. 13 is a cross-sectional diagram for describing a charge transfer operation of the image sensor illustrated in FIG. 10. Referring to FIGS. 6, 10, 13, and 15, during a charge transfer operation TRANSFER, electrons e− integrated or collected in the first substrate region 111-1 move to the electronic pocket region 119-1 according to a difference between the first gate voltage Vpg and the second gate voltage Vsl.

Here, the source voltage Vsrc may be 0V, the first gate voltage Vpg may be a first charge transfer voltage Vtran1, the second gate voltage Vsl may be a second charge transfer voltage Vtran2, and each voltage Vtran1 and Vtran2 may be a voltage between −3V and +3V. Here, the first charge transfer voltage Vtran1 may be lower than the second charge transfer voltage Vtran2.

FIG. 14 is a cross-sectional diagram for describing a selection operation and a read operation of the image sensor illustrated in FIG. 10. Referring to FIGS. 6, 10, 14, and 15, during a selection operation and a read operation SELECT/READ, when each of the first gate voltage Vpg and the second gate voltage Vsl is a negative voltage, a threshold voltage of the second PMOS transistor or a current flowing in a channel of the second PMOS transistor is determined according to the number of electrons e− stored in the electronic pocket region 119-1.

Here, an output signal Vout corresponding to the adjusted threshold voltage of the second PMOS transistor and/or the adjusted current flowing in a channel of the second PMOS transistor may be output through the first region 113-1 of the first PMOS transistor.

Here, the source voltage Vsrc may be a voltage between −3V and +3V as an operation voltage Vdd, the first gate voltage Vpg may be a first read voltage Vread, the second gate voltage Vsl may be a second read voltage Vread2, and each voltage Vread1 and Vread2 may be a negative voltage, e.g., a voltage between −3V and 0V. Here, the first read voltage Vread1 is slightly higher than the second read voltage Vread2. When the selection operation and the read operation SELECT/READ are not performed, the first gate voltage Vpg and the second gate voltage Vsl are 0V, respectively.

Each voltage Vsrc, Vpg, and Vsl and the waveforms illustrated in FIGS. 6 and 15 are merely exemplifications for convenience of description, and may be variously changed according to an image sensor design specification.

Figure 16:
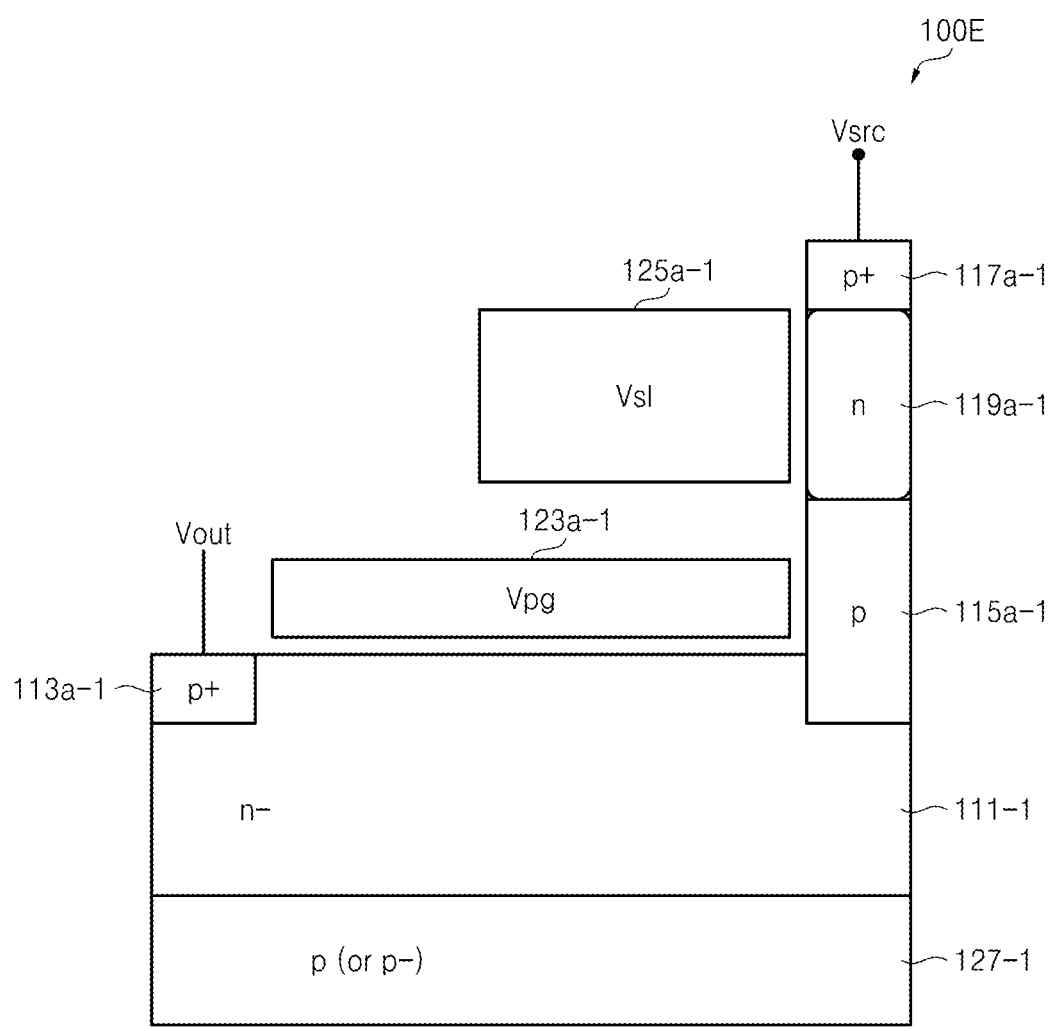
FIG. 16 is a cross-sectional diagram of an image sensor including two PMOS transistors according to still another example embodiment of inventive concepts.

FIG. 16 is a cross-sectional diagram of an image sensor including two PMOS transistors according to still another example embodiment of inventive concepts. Referring to FIG. 16, a pixel 100E of an image sensor includes the first PMOS transistor and the second PMOS transistor which share a shared region 115a-1. That is, the pixel 100E may be embodied in two PMOS transistors. The pixel 100E of the image sensor may be embodied in a vertical transistor type.

The first PMOS transistor performing a function of the photogate structure, i.e., a photogate transistor, includes a first region 113a-1 doped with p-type impurities, the shared region 115a-1 doped with p-type impurities, and a first gate electrode 123a-1 receiving the first gate voltage Vpg. Each region 113a-1 and 115a-1 is formed in the first substrate region 111-1 according to the ion implantation process.

The second PMOS transistor performing a function of a sensing transistor includes the shared region 115a-1, the second region 117a-1 doped with p-type impurities, the second gate electrode 125a-1 receiving the second gate voltage Vsl, and the electronic pocket region 119a-1 doped with n-type impurities. Each region 115a-1, 117a-1, and 119a-1 may be embodied in a vertical structure.

Except that the pixel 100B of FIG. 8 has an NMOS transistor structure and the pixel 100E of FIG. 16 has a PMOS transistor structure, a structure and an operation of each pixel 100B and 100E are substantially the same as each other.

Figure 17:
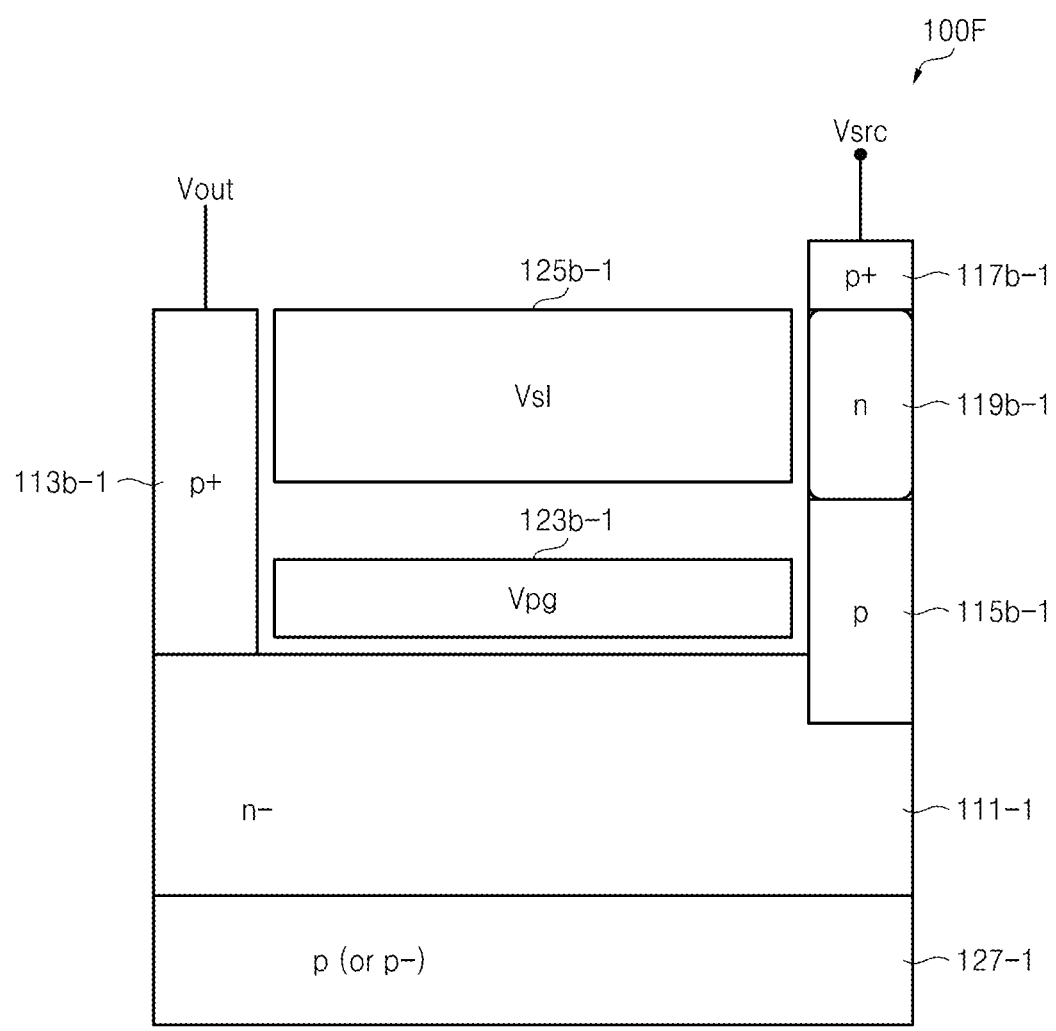
FIG. 17 is a cross-sectional diagram of an image sensor including two PMOS transistors according to still another example embodiment of inventive concepts.

FIG. 17 is a cross-sectional diagram of an image sensor including two PMOS transistors according to still another example embodiment of inventive concepts. Referring to FIG. 17, a pixel 100F of an image sensor includes the first PMOS transistor and the second PMOS transistor which share a shared region 115b-1. That is, the pixel 100F may be embodied in two NMOS transistors. The pixel 100F of the image sensor may be embodied in a vertical transistor type.

The first PMOS transistor performing a function of the photogate transistor includes a first region 113b-1 doped with p-type impurities, the shared region 115b-1 doped with p-type impurities, and the first gate electrode 123b-1.

The second NMOS transistor performing a function of a sensing transistor includes the shared region 115b-1, the second region 117b-1 doped with p-type impurities, the second gate electrode 125b-1, and the electronic pocket region 119b-1 doped with n-type impurities.

Except that the pixel 100C of FIG. 9 has an NMOS transistor structure and the pixel 100F of FIG. 17 has a PMOS transistor structure, a structure and an operation of each pixel 100C and 100F are substantially the same as each other.

Figure 18:
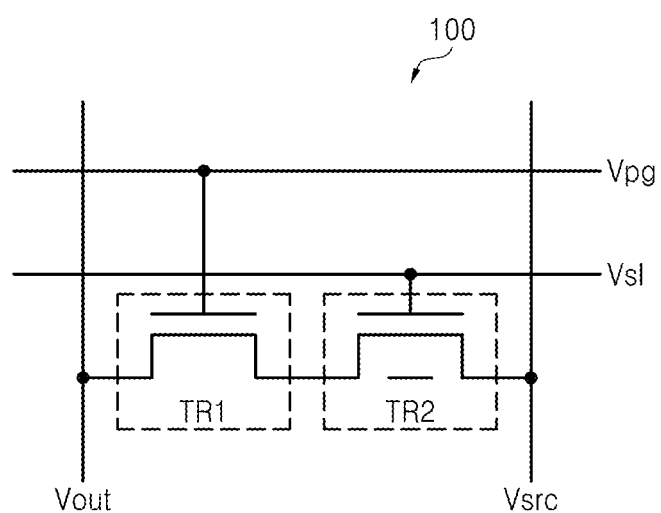
FIG. 18 is a conceptual circuit diagram of the image sensor illustrated in FIG. 1, 8, 9, 10, 16, or 17.

FIG. 18 is a conceptual circuit diagram of the image sensor illustrated in FIG. 1, 8, 9, 10, 16, or 17. Referring to FIGS. 1, 8, 9, 10, 16, 17, and 18, each pixel 100A to 100F, collectively "100", as illustrated in FIG. 18, may be modeled into two transistors TR1 and TR2 which share the shared region 115, 115-1, 115a, 115a-1, 115b, or 115b-1.

Figure 19:
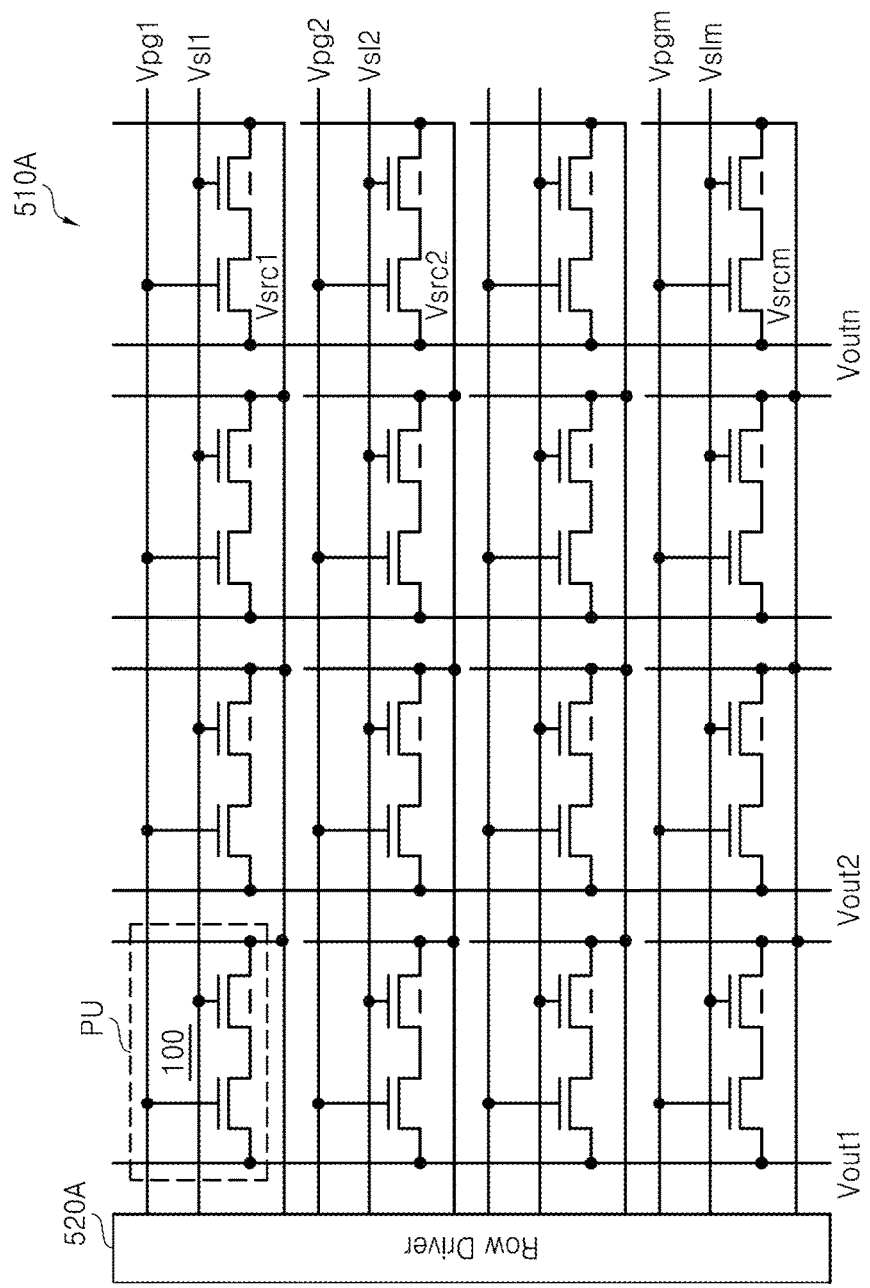
FIG. 19 is an example embodiment of a pixel array including the image sensor illustrated in FIG. 1, 8, 9, 10, 16, or 17, and driven in a rolling shutter method.

FIG. 19 is an example embodiment of a pixel array including the image sensor illustrated in FIG. 1, 8, 9, 10, 16, or 17, and driven in a rolling shutter method. Referring to FIG. 19, a pixel array 510A of the image sensor includes a plurality of pixels 100, and each operation of the plurality of pixels 100 is controlled by a row driver 520A. Each of the plurality of pixels 100 outputs an output signal Vout1-Voutn.

A plurality of pixels is embodied in a first row, and each operation of the plurality of pixels embodied in the first row is controlled by control signals Vpg1, Vsl1, and Vsrc1. In addition, a plurality of pixels is embodied in an $m^{th}$ row, and each operation of the plurality of pixels embodied in the $m^{th}$ row is controlled by control signals Vpgm, Vslm, and Vsrcm.

That is, a plurality of pixels embodied in each row is controlled by control signals Vpgi, Vsli, and Vsrci, where i is equal to or greater than 1 and equal to or less than m, and i and m are natural numbers. For example, a reset operation of a plurality of pixels embodied in each row may be controlled by row.

Figure 20:
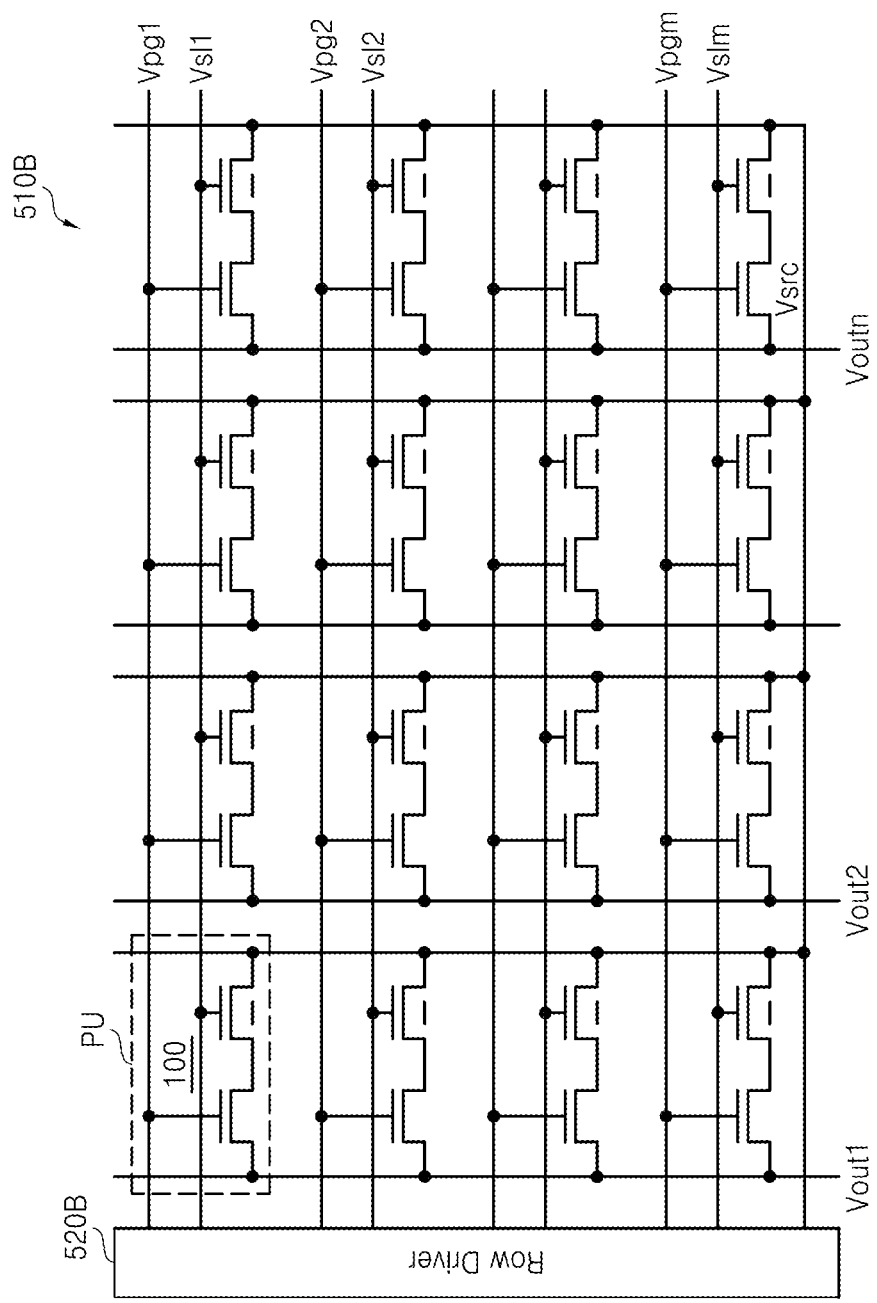
FIG. 20 is an example embodiment of a pixel array including the image sensor illustrated in FIG. 1, 8, 9, 10, 16, or 17, and driven in a global shutter method.

FIG. 20 is an example embodiment of a pixel array which includes the image sensor illustrated in FIG. 1, 8, 9, 10, 16, or 17 and is driven in a global shutter method.

A pixel array 510B of the image sensor includes a plurality of pixels 100, and each operation of the plurality of pixels 100 is controlled by a row driver 520B. Each of the plurality of pixels 100 outputs an output signal Vout1 to Voutn.

A plurality of pixels is embodied in a first row, and each operation of the plurality of pixels embodied in the first row is controlled by control signals Vpg1, Vsl1, and Vsrc. In addition, a plurality of pixels is embodied in a $m^{th}$ row, and each operation of the plurality of pixels embodied in the $m^{th}$ row is controlled by control signals Vpgm, Vslm, and Vsrc.

That is, a plurality of pixels embodied in each row is controlled by control signals Vpgi, Vsli, and Vsrc output by row, where i is equal to or greater than 1 and equal to or less than m, and i and m are natural numbers. According to a global shutter operation, a reset operation of all pixels 100 embodied in the pixel array 510B may be controlled according to one source voltage Vsrc.

Figure 21:
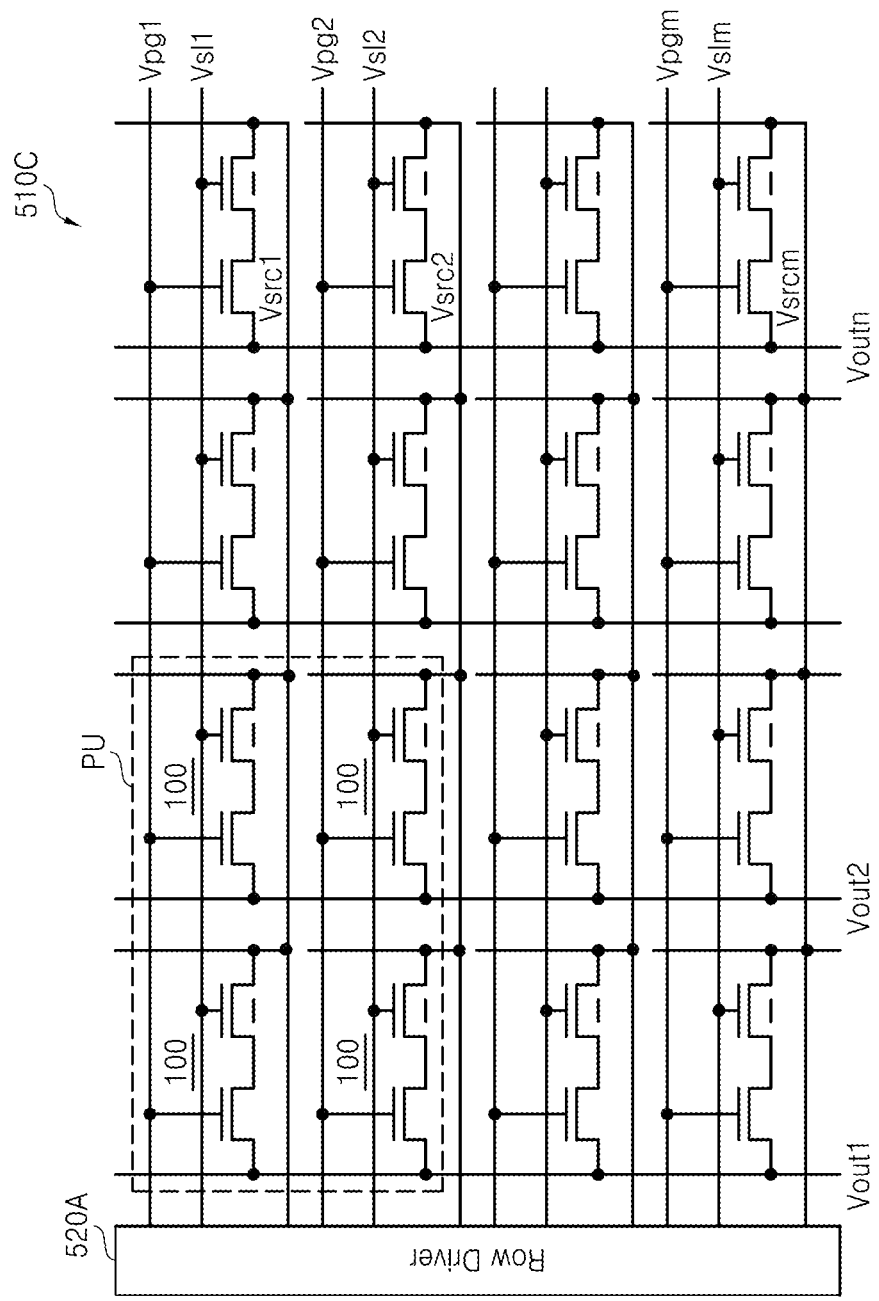
FIG. 21 is another example embodiment of the pixel array including the image sensor illustrated in FIG. 1, 8, 9, 10, 16, or 17, and driven in a rolling shutter method.

FIG. 21 is another example embodiment of the pixel array including the image sensor illustrated in FIG. 1, 8, 9, 10, 16, or 17, and driven in a rolling shutter method. Referring to FIGS. 19 and 21, a pixel array 510C includes a plurality of pixel units PU. In FIG. 19, the pixel unit PU includes one pixel 100, but one pixel unit PU in FIG. 21 includes four pixels 100. According to an example embodiment, the pixel unit PU may include four or more pixels 100.

Figure 22:
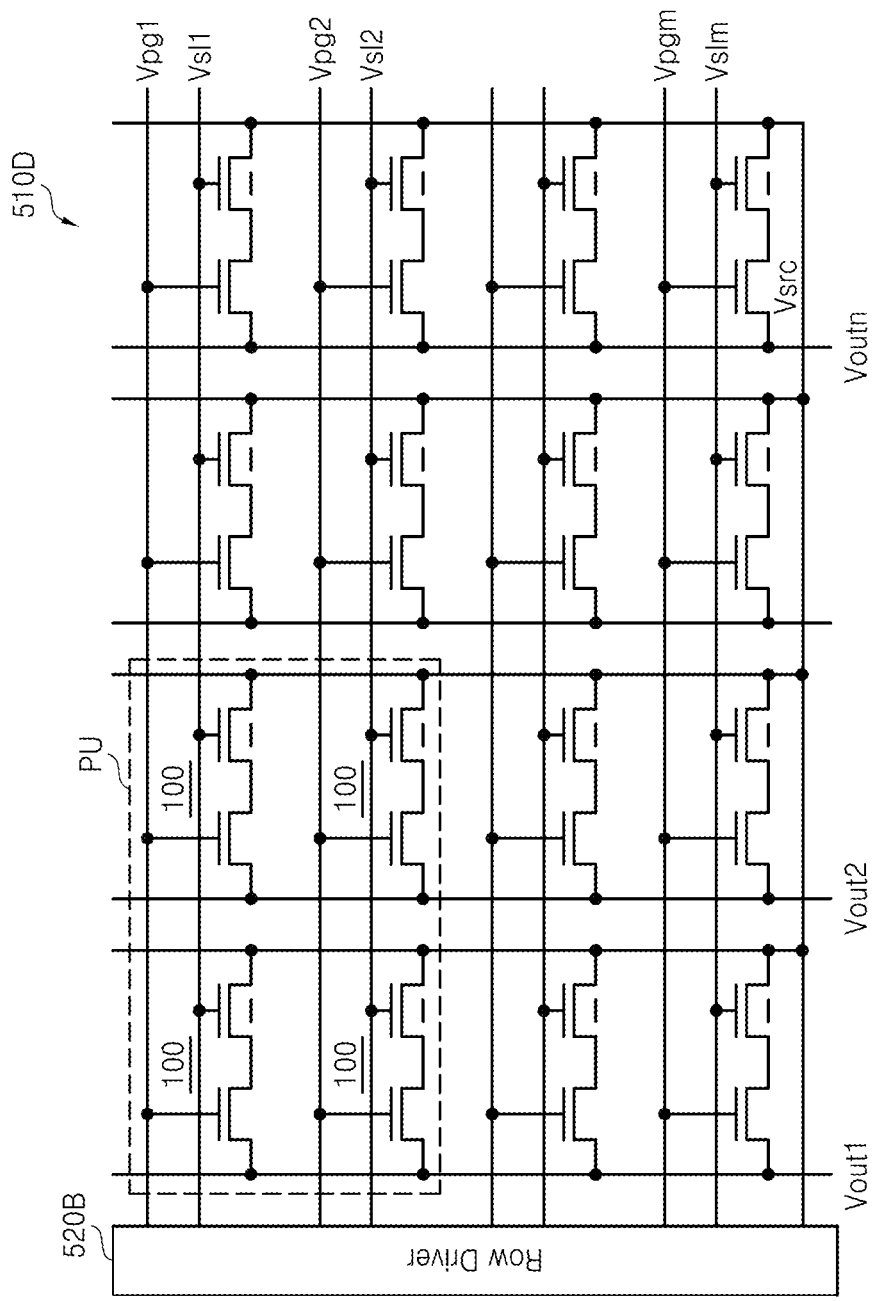
FIG. 22 is another example embodiment of the pixel array including the image sensor illustrated in FIGS. 1, 8, 9, 10, 16, and 17, and driven in a global shutter method.

FIG. 22 is another example embodiment of the pixel array including the image sensor illustrated in FIG. 1, 8, 9, 10, 16, or 17, and driven in a global shutter method. Referring to FIGS. 20 and 22, a pixel array 510D includes a plurality of pixel units PU. A pixel unit PU in FIG. 20 includes one pixel 100, but a pixel unit PU in FIG. 22 includes four pixels 100. According to an example embodiment, the pixel unit PU may include four or more pixels 100.

Figure 25:
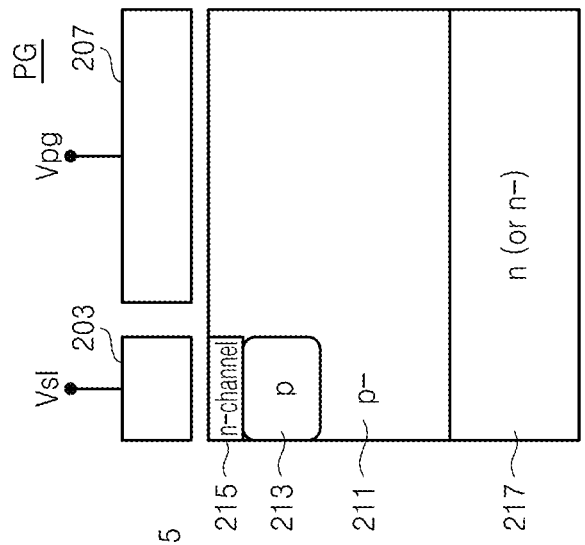
FIG. 25 is a cross-sectional diagram of the image sensor illustrated in FIG. 23 taken along a line IV-IV'.
Figure 24:
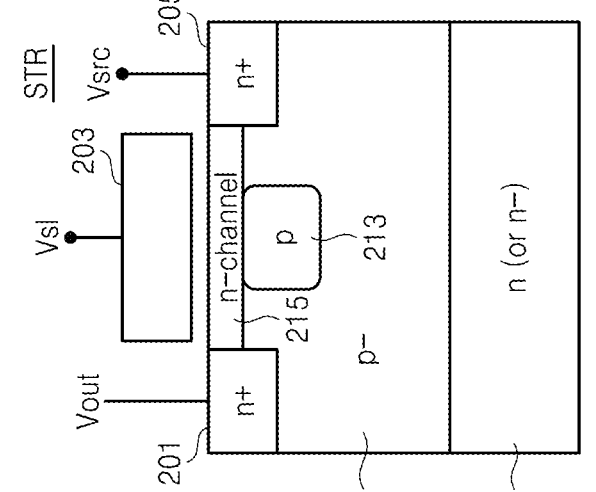
FIG. 24 is a cross-sectional diagram of the image sensor illustrated in FIG. 23 taken along a line III-III'.
Figure 23:
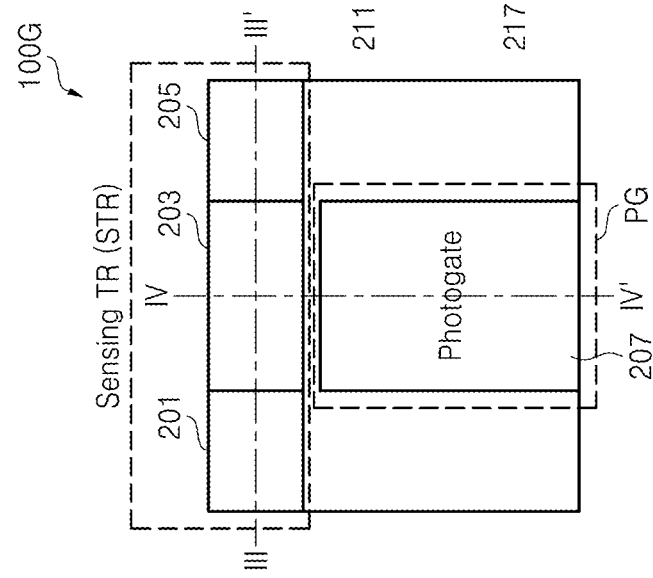
FIG. 23 is a plan view of an image sensor including a photogate and an NMOS transistor according to an example embodiment of inventive concepts.

FIG. 23 is a plan view of an image sensor including a photogate and an NMOS transistor according to an example embodiment of inventive concepts, FIG. 24 is a cross-sectional diagram of the image sensor illustrated in FIG. 23 taken along a line III-III', and FIG. 25 is a cross-sectional diagram of the image sensor illustrated in FIG. 23 taken along a line IV-IV'. Referring to FIGS. 23 to 25, a pixel 100G including a photogate PG and an NMOS transistor STR includes a third region 201, a second gate electrode 203, a fourth region 205, and a first gate electrode 207.

The first gate electrode 207 of the photogate structure, i.e., photogate PG, may adjust a charge integration capability and full well capacity(FWC) based on the first gate voltage Vpg.

The sensing transistor STR including regions 201, 203, and 205 may perform a selection operation and a read operation. A pixel 100G including a big photogate PG and a small sensing transistor STR may enhance light guiding (or receiving) efficiency and sensing sensitivity.

The sensing transistor STR includes the third region 201 doped with n-type impurities, the second gate electrode 203, the fourth region 205 doped with n-type impurities, and the hole pocket region 213. Each region 201, 205, and 213 is formed in the first substrate region 211 doped with p-type impurities. For example, each region 201, 205, and 213 may be formed through the ion implantation process.

A doping density p of the hole pocket region 213 may be higher than a doping density p− of the first substrate region 211. The hole pocket region 213 may be formed between a third region 201 and a fourth region 205 and under the second gate electrode 203 at a given (or alternatively desired or predetermined) depth from the upper surface of the first substrate region 211. Each insulation layer may be formed between each gate electrode 203 and 207 and the upper surface of the first substrate region 211.

An output signal Vout is output through the third region 201, the first gate voltage Vpg is input to the first gate electrode 207, the second gate voltage Vsl is supplied to the second gate electrode 203, and the source voltage Vsrc is supplied to the fourth region 205.

According to an example embodiment, the n-channel region 215 may be formed under the upper surface of the first substrate region 211 between the third region 201 and the fourth region 205. Here, the n-channel region 215 may be formed through the ion implantation process.

The n-channel region 215 may be embodied so as to adjust a threshold voltage of the sensing transistor STR. That is, when a pixel 100G includes the n-channel region 215, a threshold voltage of the sensing transistor STR decreases. According to another example embodiment, the pixel 100G may further include a second substrate region 217 formed under the first substrate region 211 and doped with n-type impurities.

A doping density n or n−× of the second substrate region 217 is equal to or lower than a doping density n+ of each region 201 and 205. The first substrate region 211 and the second substrate region 217 may be included in a silicon substrate or an epitaxial layer.

According to example embodiments, the pixel 100G may include at least one of the n-channel region 215 and the second substrate region 217. According to an example embodiment, a role of the third region 201 and a role of the fourth region 205 may be changed to each other. For example, when the fourth region 205 is a source, the third region 201 may be a drain.

When each gate electrode 203 and 207 is embodied in polysilicon, an image sensor including the pixel 100G may be embodied in a BSI structure. However, when each gate electrode 203 and 207 is embodied in a transparent electrode material, the image sensor including the pixel 100G may be embodied in a FSI structure.

The pixel 100G operates in an order as follow.

First, the pixel 100G may operate in an order of a reset operation, a charge integration operation, a charge transfer operation, and a read operation.

Second, the pixel may operate in an order of a reset operation, a charge integration operation, a read operation, a charge transfer operation, and a read operation.

Third, the pixel 100G may operate in an order of a reset operation, a read operation, a charge integration operation, a charge transfer operation, and a read operation.

Before and after the charge integration operation, in order to compare pixel signals output from the pixel 100G, two-time read operations may be performed. Here, the image sensor including the pixel 100G may include CDS circuits which may perform a CDS operation for the pixel signals.

Figure 26:
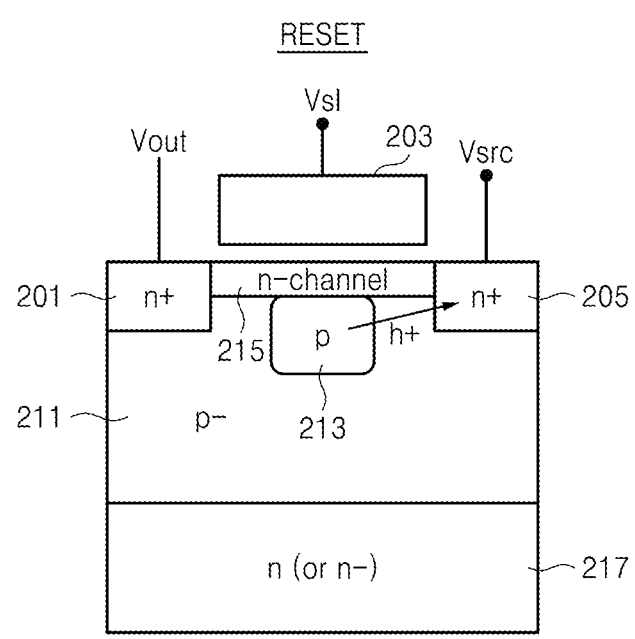
FIG. 26 is a cross-sectional diagram for describing a reset operation of the image sensor illustrated in FIGS. 23 to 25.

FIG. 26 is a cross-sectional diagram for describing a reset operation of the image sensor illustrated in FIGS. 23 to 25, FIG. 30 is a table of voltages for operation of each image sensor illustrated in FIGS. 23 to 29, and FIG. 31 is a waveform of a voltage supplied to each region of each image sensor illustrated in FIGS. 23 to 29.

Referring to FIGS. 24, 25, 26, 30, and 31, during a reset operation RESET, holes h+ in the hole pocket region 213 of the sensing transistor STR are removed through the fourth region 205. That is, the pixel 100G is initialized. Here, the source voltage Vsrc may be lower than −1.5V as a reset voltage Vreset, the first gate voltage Vpg may be higher than 0V, and the second gate voltage Vsl may be 0V or a ground voltage.

Figure 27:
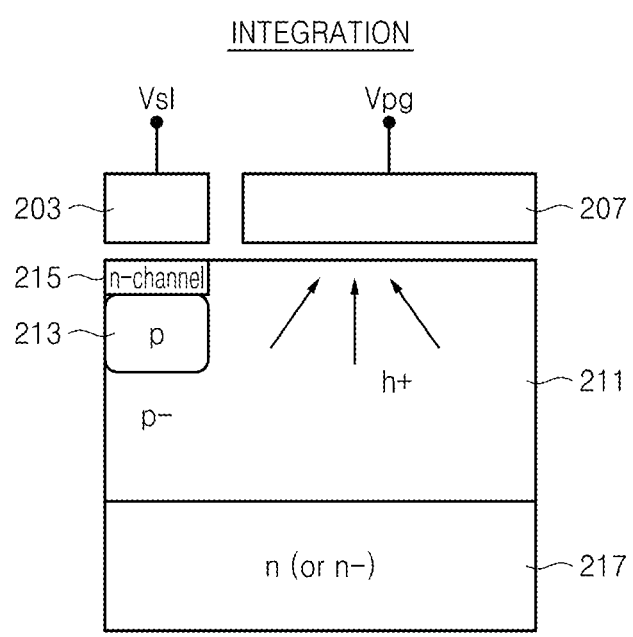
FIG. 27 is a cross-sectional diagram for describing a charge integration operation of the image sensor illustrated in FIGS. 23 to 25.

FIG. 27 is a cross-sectional diagram for describing a charge integration operation of the image sensor illustrated in FIGS. 23 to 25.

Referring to FIGS. 24, 25, 27, 30, and 31, during a charge integration operation INTEGRATION, photo charges are generated in the first substrate region 211 by light incident into the first substrate region 211, and holes h+ among the photo charges are integrated or collected in the first substrate region 211 positioned under the first gate electrode 207 according to the first gate voltage Vpg supplied to the first gate electrode 207. The charge integration operation is performed by the photogate PG. For example, the number of photo charges may be determined by the intensity of incident light.

Here, the source voltage Vsrc and the second gate voltage Vsl are 0V or a ground voltage, respectively, and the first gate voltage Vpg may be 0V or a negative voltage as a charge integration voltage Vint. The negative voltage may be a voltage between −5V and 0V.

Figure 28:
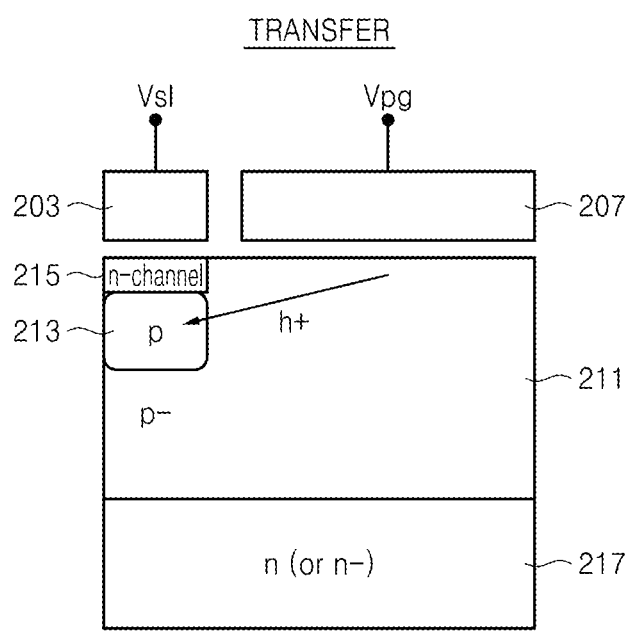
FIG. 28 is a cross-sectional diagram for describing a charge transfer operation of the image sensor illustrated in FIGS. 23 to 25.

FIG. 28 is a cross-sectional diagram for describing a charge transfer operation of the image sensor illustrated in FIGS. 23 to 25. Referring to FIGS. 24, 25, 28, 30, and 31, during a charge transfer operation TRANSFER, holes h+ integrated or collected in the first substrate region 211 move to the hole pocket region 213 according to a difference between the first gate voltage Vpg and the second gate voltage Vsl.

Here, the source voltage Vsrc may be 0V, the first gate voltage Vpg may be a first charge transfer voltage Vtran1, the second gate voltage Vsl may be a second charge transfer voltage Vtran2, and each voltage Vtran1 and Vtran2 may be a voltage between −3V and +3V. Here, the first charge transfer voltage Vtran1 may be higher than the second charge transfer voltage Vtran2.

Figure 29:
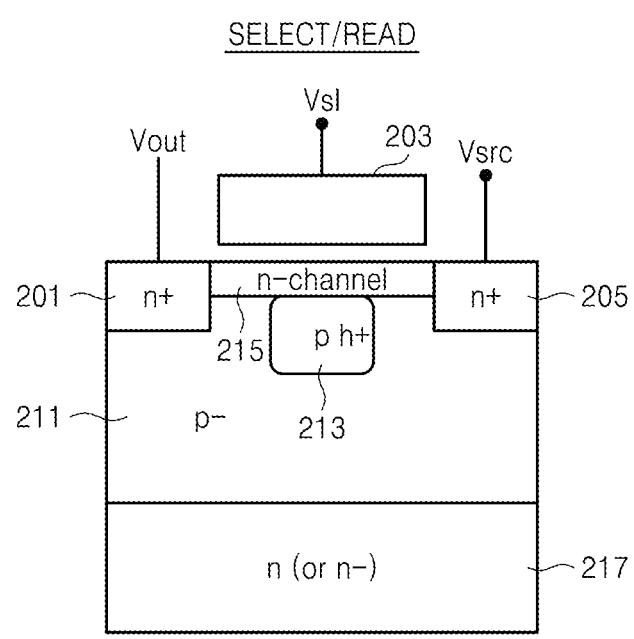
FIG. 29 is a cross-sectional diagram for describing a selection operation and a read operation of the image sensor illustrated in FIGS. 23 to 25.

FIG. 29 is a cross-sectional diagram for describing a selection operation and a read operation of the image sensor illustrated in FIGS. 23 to 25. Referring to FIGS. 24, 25, 29, 30, and 31, during a selection operation and a read operation SELECT/READ, when each of the first gate voltage Vpg and the second gate voltage Vsl is a positive voltage, an output signal Vout of the pixel 100G is output according to the holes h+ stored in the hole pocket region 213.

For example, a threshold voltage of the sensing transistor STR and/or a current flowing in a channel of the sensing transistor STR may be adjusted according to the number of the holes h+ stored in the hold pocket region 213.

An output signal Vout corresponding to the adjusted threshold voltage of the sensing transistor STR and/or the adjusted current flowing in a channel of the sensing transistor STR may be output through the first region 113 of the sensing transistor STR.

Here, the source voltage Vsrc may be a voltage between −3V and +3V as an operation voltage Vdd, the first gate voltage Vpg may be a first read voltage Vread1, the second gate voltage Vsl may be a second read voltage Vread2, and each read voltage Vread1 and Vread2 may be a positive voltage, e.g., a voltage between 0V and +3V. Here, a first read voltage Vread1 may be slightly higher than a second read voltage Vread2. When a selection operation and a read operation SELECT/READ are not performed, the first gate voltage Vpg and the second gate voltage Vsl are 0V, respectively.

Figure 31:
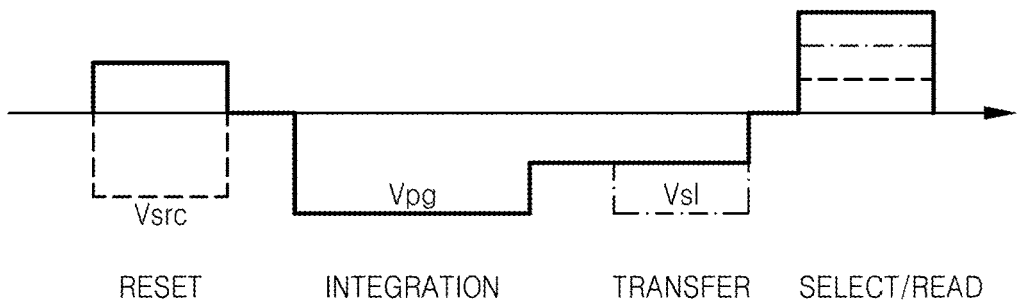
FIG. 31 is a waveform of a voltage supplied to each region of each image sensor illustrated in FIGS. 23 to 29.

Each voltage Vsrc, Vpg, and Vsl and the waveforms illustrated in FIGS. 30 and 31 are merely exemplifications for convenience of description, and may be variously changed according to a design specification.

Figure 34:
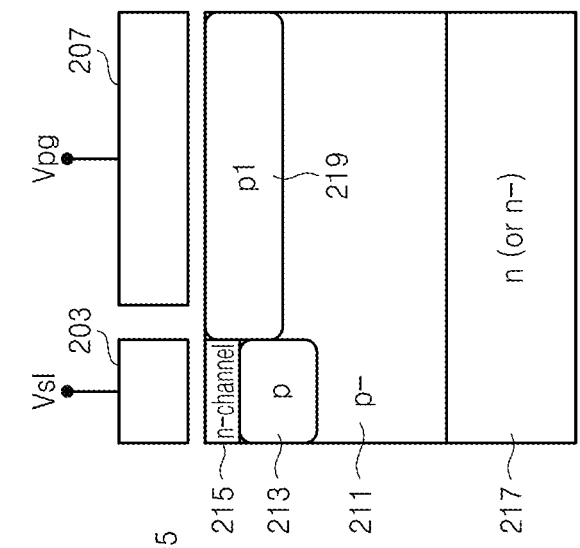
FIG. 34 is a cross-sectional diagram of the image sensor illustrated in FIG. 32 taken along a line IV-IV'.
Figure 33:
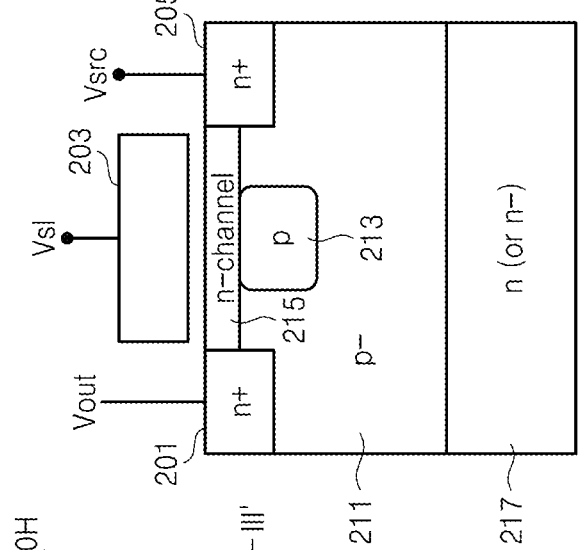
FIG. 33 is a cross-sectional diagram of the image sensor illustrated in FIG. 32 taken along a line III-III'.
Figure 32:
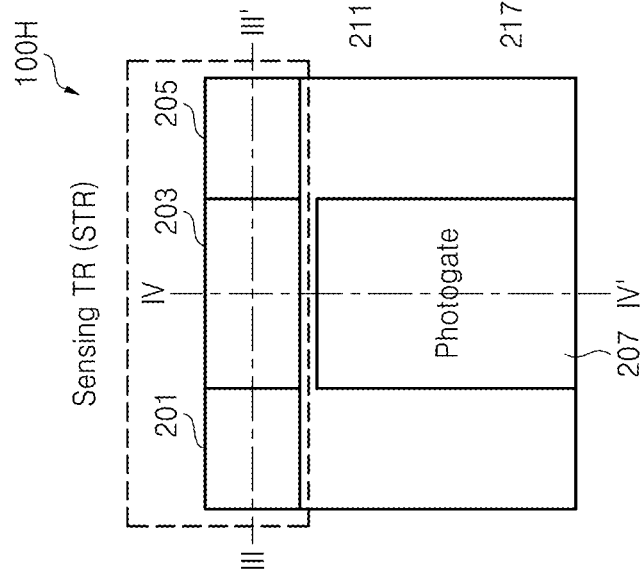
FIG. 32 is a plan view of an image sensor including a photogate having a p-type photodiode and an NMOS transistor according to another example embodiment of inventive concepts.

FIG. 32 is a plan view of an image sensor including a photogate having a p-type photodiode and an NMOS transistor according to another example embodiment of inventive concepts, FIG. 33 is a cross-sectional diagram of the image sensor illustrated in FIG. 32 taken along a line III-III', and FIG. 34 is a cross-sectional diagram of the image sensor illustrated in FIG. 32 taken along a line IV-IV'.

Except for a photodiode 219 doped with p-type impurities, a structure and an operation of the pixel 100G described referring to FIGS. 23 to 31 are substantially the same as a structure and an operation of a pixel 100H illustrated in FIGS. 32 to 34. For example, a doping density p1 of the photodiode 219 may be lower than the doping density p of the hole pocket region 213, and higher than the doping density p− of the first substrate region 211.

FIG. 35 is a plan view of an image sensor including a wide photogate and an NMOS transistor according to still another example embodiment of inventive concepts, FIG. 36 is a cross-sectional diagram of the image sensor illustrated in FIG. 35 taken along a line III-III', and FIG. 37 is a cross-sectional diagram of the image sensor illustrated in FIG. 35 taken along a line IV-IV'.

Except for a size of the first gate electrode 207a of the photogate PG, a structure and an operation of the pixel 100G described referring to FIGS. 23 to 31 are substantially the same as the structure and the operation of a pixel 100I illustrated in FIGS. 35 to 37. The size of the first gate electrode 207a of a photogate PG of the pixel 100I is greater than a size of the first gate electrode 207 of a photogate PG of the pixel 100G. For example, a size of the photogate PG may be defined as a size of the first gate electrode 207 or 207a.

Figure 40:
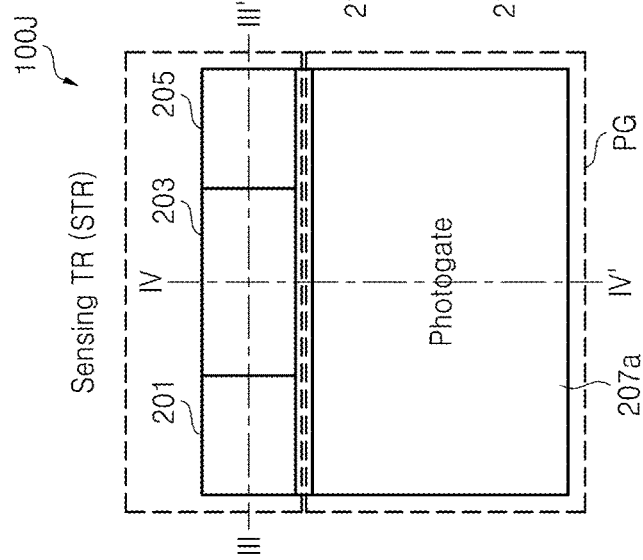
FIG. 40 is a cross-sectional diagram of the image sensor illustrated in FIG. 38 taken along a line IV-IV'.
Figure 39:
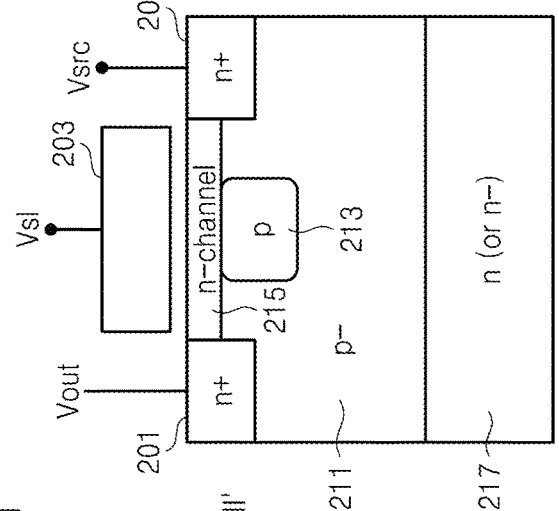
FIG. 39 is a cross-sectional diagram of the image sensor illustrated in FIG. 38 taken along a line III-III'.
Figure 38:
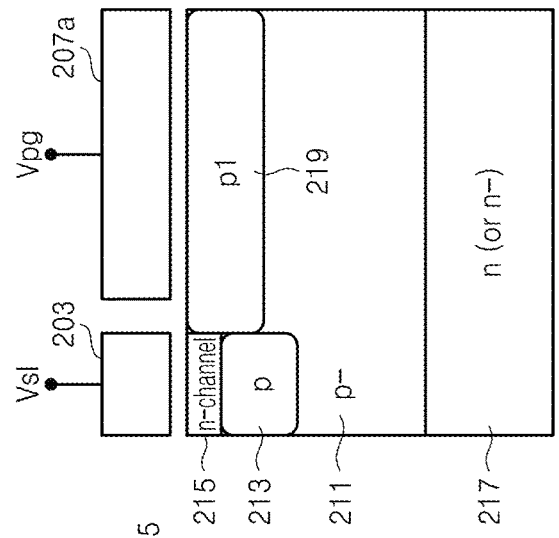
FIG. 38 is a plan view of an image sensor including a wide photogate having the p-type photodiode and the NMOS transistor according to another example embodiment of inventive concepts.

FIG. 38 is a plan view of an image sensor including a wide photogate having a p-type photodiode and an NMOS transistor according to another example embodiment of inventive concepts, FIG. 39 is a cross-sectional diagram of the image sensor illustrated in FIG. 38 taken along a line III-III', and FIG. 40 is a cross-sectional diagram of the image sensor illustrated in FIG. 38 taken along a line IV-IV'.

Except for the first gate electrode 207a and a size of the p-type photodiode 219, a structure and an operation of the pixel 100G described referring to FIGS. 23 to 31 are substantially the same as a structure and an operation of a pixel 100J described in FIGS. 38 to 40.

Figure 42:
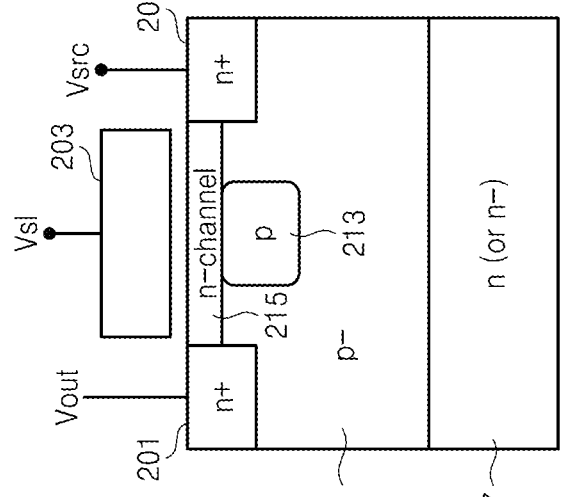
FIG. 42 is a cross-sectional diagram of the image sensor illustrated in FIG. 41 taken along a line III-III'.
Figure 43:
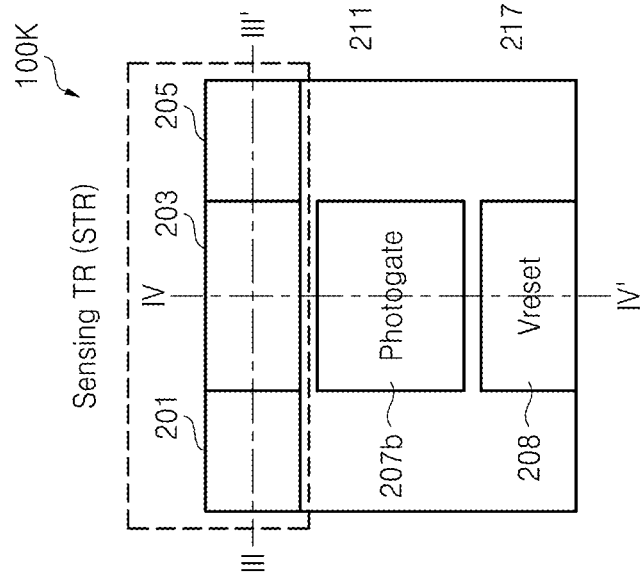
FIG. 43 is a cross-sectional diagram of the image sensor illustrated in FIG. 41 taken along a line IV-IV'.

FIG. 41 is a plan view of an image sensor including a reset electrode, a photogate, and the NMOS transistor according to still another example embodiment of inventive concepts, FIG. 42 is a cross-sectional diagram of the image sensor illustrated in FIG. 41 taken along a line III-III', and FIG. 43 is a cross-sectional diagram of the image sensor illustrated in FIG. 41 taken along a line IV-IV'.

Except for an embodiment position and a size of the first gate electrode 207b and a reset region 208, a structure and an operation of the pixel 100G described referring to FIGS. 23 to 31 are substantially the same as a structure and an operation of a pixel 100K described in FIGS. 41 to 43. A reset voltage Vreset is supplied to a reset region 208 through a reset electrode. A doping density p+ of the reset region 208 may be embodied to be higher than the doping density p of the hold pocket region 213.

FIG. 44 is a plan view of an image sensor including the photogate and the PMOS transistor according to another example embodiment of inventive concepts, FIG. 45 is a cross-sectional diagram of the image sensor illustrated in FIG. 44 taken along a line III-III', and FIG. 46 is a cross-sectional diagram of the image sensor illustrated in FIG. 44 taken along a line IV-IV'.

Referring to FIGS. 44 to 46, a pixel 100L including a photogate and a PMOS transistor includes a third region 201-1, a second gate electrode 203-1, a fourth region 205-1, and a first gate electrode 207-1.

The first gate electrode 207-1 of the photogate may adjust a charge integration capability and full well capacity (FWC) based on the first gate voltage Vpg. The sensing transistor STR including regions 201-1, 203-1, and 205-1 may perform a selection operation and a read operation.

The sensing transistor STR includes the third region 201-1 doped with p-type impurities, the second gate electrode 203-1, the fourth region 205-1 doped with p-type impurities, and an electronic pocket region 213-1. Each region 201-1, 205-1, and 213-1 is formed in the first substrate region 211-1 doped with n-type impurities. For example, each region 201-1, 205-1, and 213-1 may be formed through the ion implantation process.

A doping density n of the electronic pocket region 213-1 may be higher than the doping density n− of the first substrate region 211-1. The electronic pocket region 213-1 may be formed between the third region 201-1 and the fourth region 205-1 and under the second gate electrode 203-1 at a given (or alternatively desired or predetermined) depth from the upper surface of the first substrate region 211-1. An insulation layer may be formed between each gate electrode 203-1 and 207-1 and the upper surface of the first substrate region 211-1.

An output signal Vout is output through the third region 201-1, the first gate voltage Vpg is input to the first gate electrode 207-1, the second gate voltage Vsl is supplied to the second gate electrode 203-1, and the source voltage Vsrc is supplied to the fourth region 205-1.

According to an example embodiment, a p-channel region 215-1 may be formed under the upper surface of the first substrate region 211-1 between the third region 201-1 and the fourth region 205-1. Here, the p-channel region 215-1 may be formed through the ion implantation process.

The p-channel region 215-1 may be embodied so as to adjust a threshold voltage of the sensing transistor STR. That is, when a pixel 100L includes the p-channel region 215-1, the threshold voltage of the sensing transistor STR decreases. According to another example embodiment, the pixel 100L may further include a second substrate region 217-1 formed under the first substrate region 211-1 and doped with p-type impurities.

A doping density p or p− of the second substrate region 217-1 may be equal to or lower than the doping density p+ of each region 201-1 and 205-1. According to example embodiments, the pixel 100L may include at least one of the p-channel region 215-1 and the second substrate region 217-1.

According to an example embodiment, a role of the third region 201-1 and a role of the fourth region 205-1 may be changed to each other. When each gate electrode 203-1 and 207-1 is embodied in polysilicon, an image sensor including the pixel 100L may be embodied in a BSI structure. However, when each gate electrode 203-1 and 207-1 is embodied in a transparent electrode material, the image sensor including the pixel 100L may be embodied in a FSI structure.

Figure 47:
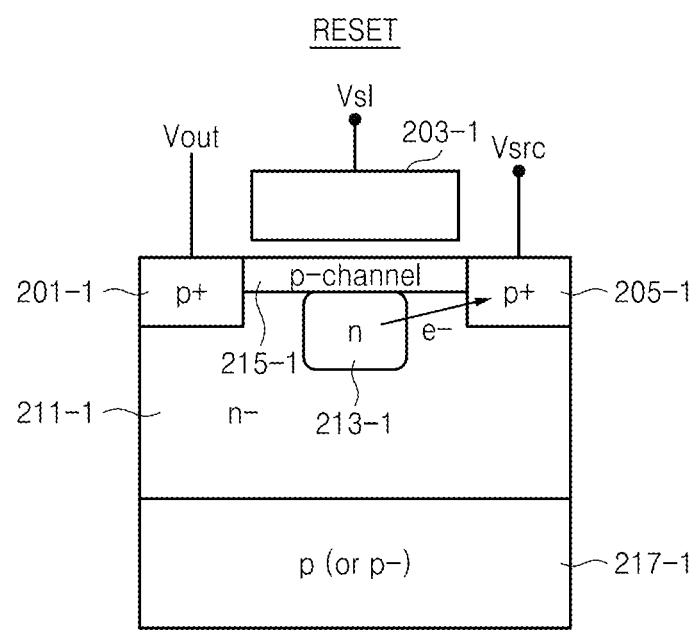
FIG. 47 is a cross-sectional diagram for describing a reset operation of the image sensor illustrated in FIGS. 44 to 46.

FIG. 47 is a cross-sectional diagram for describing a reset operation of the image sensor illustrated in FIGS. 44 to 46, and FIG. 51 is a waveform of a voltage supplied to each region of each image sensor illustrated in FIGS. 47 to 50. Referring to FIGS. 45, 46, 47, and 51, during a reset operation RESET, electrons e− in the electronic pocket region 213-1 are removed through the fourth region 205-1. Here, the source voltage Vsrc may be higher than 1.5V as a reset voltage Vreset, the first gate voltage Vpg may be lower than 0V, and the second gate voltage Vsl may be 0V or a ground voltage.

Figure 48:
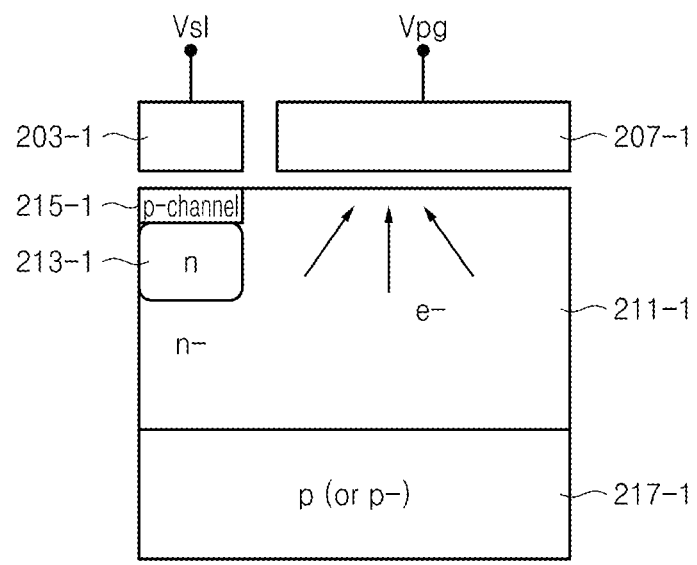
FIG. 48 is a cross-sectional diagram for describing a charge integration operation of the image sensor illustrated in FIGS. 44 to 46.

FIG. 48 is a cross-sectional diagram for describing a charge integration operation of the image sensor illustrated in FIGS. 44 to 46. Referring to FIGS. 45, 46, 48, and 51, photo charges are generated in a first substrate region 211-1 by light incident into the first substrate region 211-1, and electrons e− among the photo charges are integrated or collected in the first substrate region 211-1 positioned under the first gate electrode 203-1 according to the first gate voltage Vpg supplied to the first gate electrode 203-1.

Here, the source voltage Vsrc and the second gate voltage Vsl are 0V or a ground voltage, respectively, and the first gate voltage Vpg may be 0V or a positive voltage as a charge integration voltage Vint. The positive voltage may be a voltage between 0V and 5V.

Figure 49:
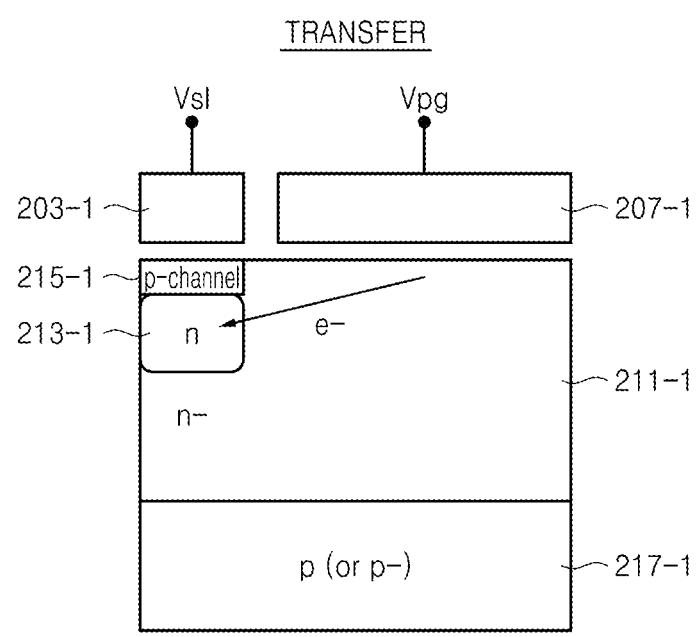
FIG. 49 is a cross-sectional diagram for describing a charge transfer operation of the image sensor illustrated in FIGS. 44 to 46.

FIG. 49 is a cross-sectional diagram for describing a charge transfer operation of the image sensor illustrated in FIGS. 44 to 46. Referring to FIGS. 45, 46, 49, and 51, during a charge transfer operation TRANSFER, electrons e− integrated or collected in the first substrate region 211-1 move to the electronic pocket region 213-1 according to a difference between the first gate voltage Vpg and the second gate voltage Vsl.

Here, the source voltage Vsrc may be 0V, the first gate voltage Vpg may be a first charge transfer voltage Vtran1, the second gate voltage Vsl may be a second charge transfer voltage Vtran2, and each voltage Vtran1 and Vtran2 may be a voltage between −3V and +3V. Here, the first charge transfer voltage Vtran1 may be lower than the second charge transfer voltage Vtran2.

Figure 50:
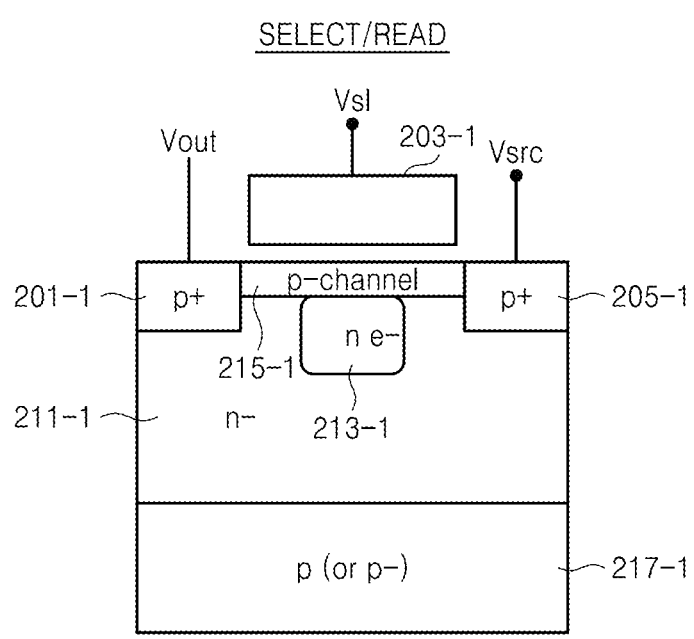
FIG. 50 is a cross-sectional diagram for describing a selection operation and a read operation of the image sensor illustrated in FIGS. 44 to 46.

FIG. 50 is a cross-sectional diagram for describing a selection operation and a read operation of the image sensor illustrated in FIGS. 44 to 46. Referring to FIGS. 45, 46, 50, and 51, during a selection operation and a read operation SELECT/READ, when each of the first gate voltage Vpg and the second gate voltage Vsl is a negative voltage, an output signal Vout of the pixel 100L is output according to the electrons e− stored in the electronic pocket region 213-1.

Here, the source voltage Vsrc may be a voltage between −3V and +3V, the first gate voltage Vpg may be a first read voltage Vread1, the second gate voltage Vsl may be a second read voltage Vread2, and each voltage Vread1 and Vread2 may be a negative voltage, e.g., a voltage between −3V and 0V. Here, the first read voltage Vread1 may be slightly lower than the second read voltage Vread2. When the selection operation and the read operation SELECT/READ are not performed, the first gate voltage Vpg and the second gate voltage Vsl are 0V.

Figure 51:
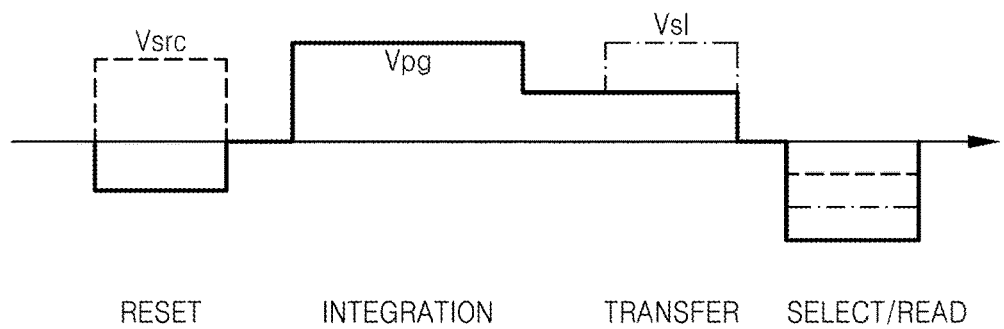
FIG. 51 is a waveform of a voltage supplied to each region of each image sensor illustrated in FIGS. 47 to 50.

Each voltage Vsrc, Vpg, and Vsl and the waveforms illustrated in FIG. 51 are merely exemplifications for convenience of description, and may be variously changed according to a design specification.

Figure 52:
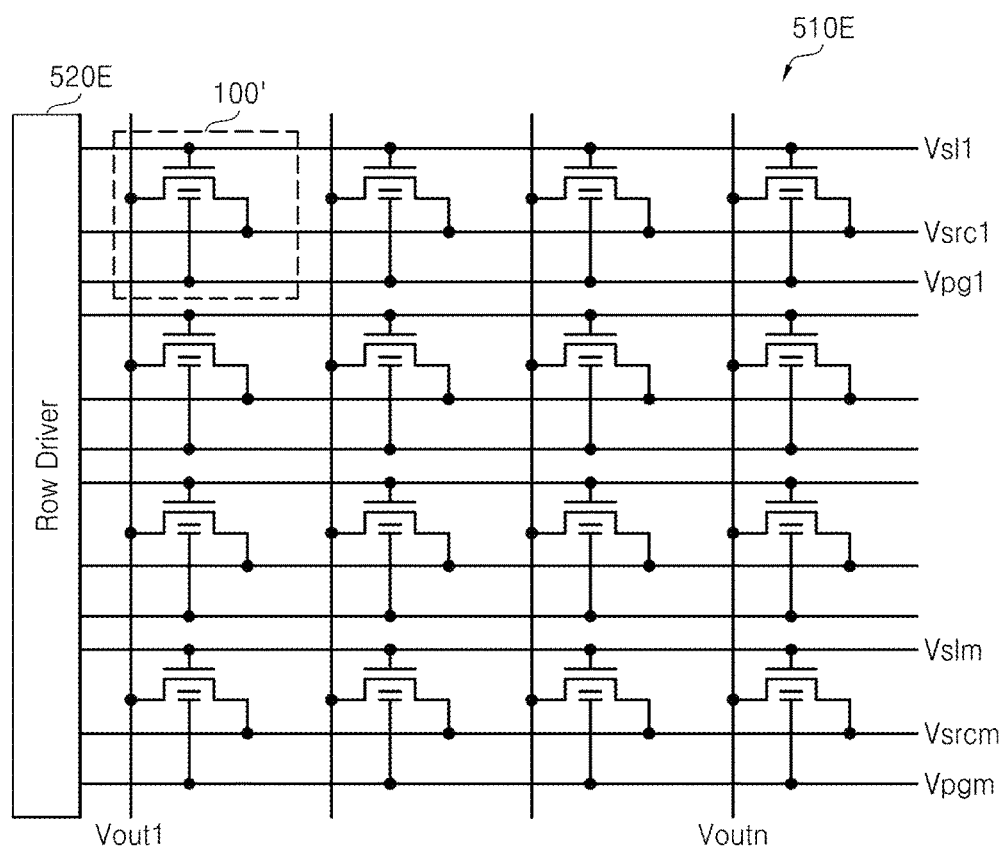
FIG. 52 is an example embodiment of a pixel array of the image sensor illustrated in FIGS. 23 to 50.

FIG. 52 is an example embodiment of a pixel array of the image sensor illustrated in FIGS. 23 to 50. Referring to FIG. 52, a pixel array 510E of an image sensor includes a plurality of pixels 100', and an operation of each of the plurality of pixels 100' is controlled by a row driver 520E. The pixel 100' collectively denotes a pixel 100G to 100H including the photogate PG and the sensing transistor STR.

A plurality of pixels is embodied in a first row, and an operation of each of the plurality of pixels embodied in the first row is controlled by control signals Vpg1, Vsl1, and Vsrc1. In addition, a plurality of pixels is embodied in a $m^{th}$ row, and each operation of the plurality of pixels embodied in the $m^{th}$ row is controlled by control signals Vpgm, Vslm, and Vsrcm. As described referring to FIGS. 19 to 22, a structure of the pixel array 510E may be embodied the same as a structure of each pixel array 510A to 510E.

Figure 53:
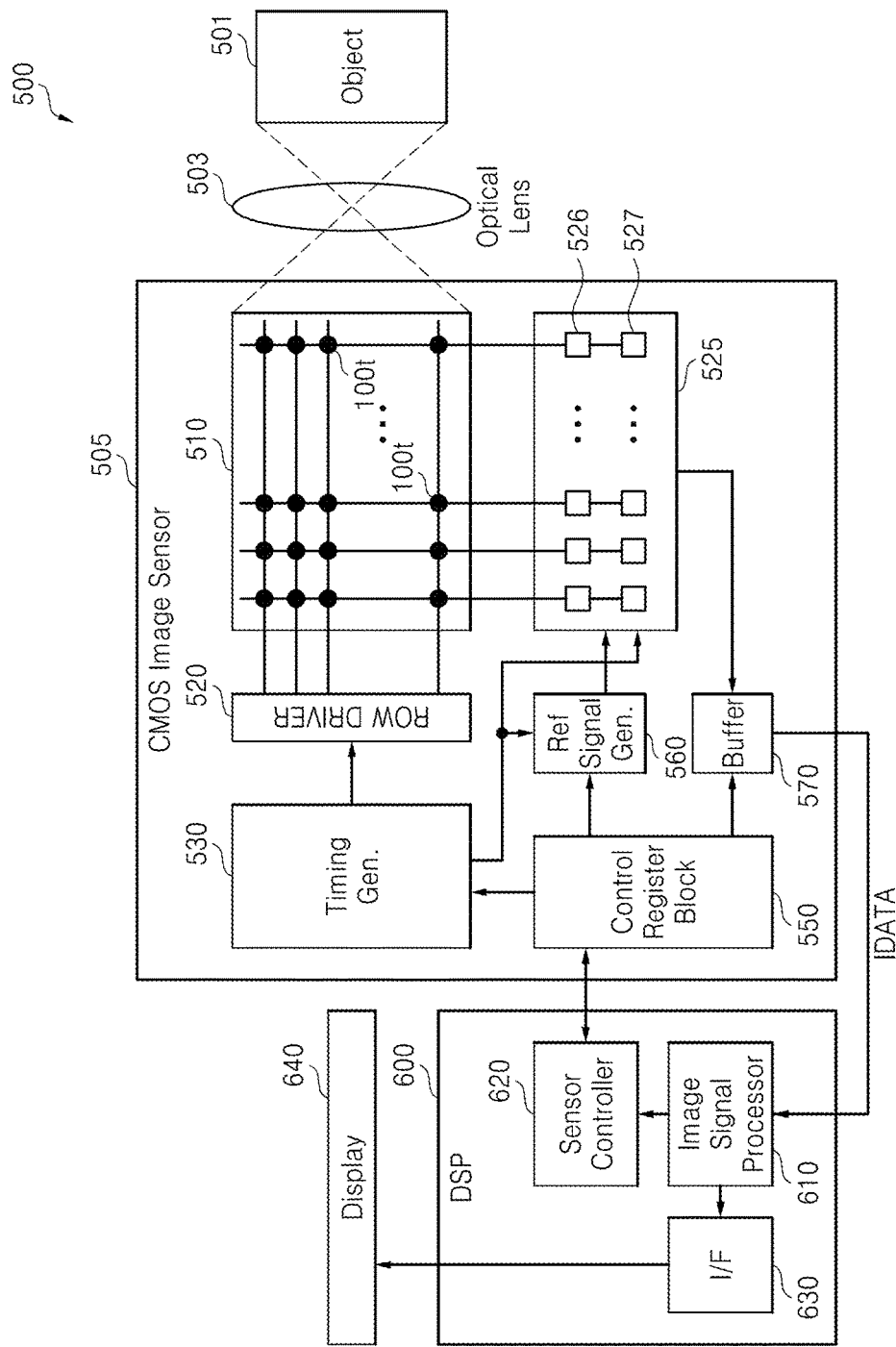
FIG. 53 is a block diagram of an image processing system including a pixel according to an example embodiment of inventive concepts.

FIG. 53 is a block diagram of an image processing system including a pixel according to an example embodiment of inventive concepts. Referring to FIGS. 1 to 53, an image processing system 500 may be embodied in a portable electronic device including a digital camera, a camcorder, or a CMOS image sensor 505. The portable electronic device may be embodied in a mobile phone, a smart phone, a tablet PC, or a mobile internet device(MID).

The image processing system 500 includes an optical lens 503, a CMOS image sensor 505, a digital signal processor 600, and a display 640. The CMOS image sensor 505 may generate image data IDATA for an object 501 incident through the optical lens 503.

The CMOS image sensor 505 includes a pixel array 510A, 510B, 510C, or 510E, collectively "510", a row driver 520A, 520B, 520C, 520D, or 520E, collectively "520", a readout circuit 525, a timing generator 530, a control register block 550, a reference signal generator 560, and a buffer 570.

The pixel array 510 includes a plurality of pixels 100 or 100', collectively "100t". The pixel 100t collectively denotes one of pixels 100A to 100L. The pixel 100t of an image sensor may be manufactured using a CMOS manufacture process. The pixel array 510 includes pixels 100t arranged in a matrix shape. Each pixel 100t transfers an output signal Vout to each column line.

The row driver 520 drives control voltages, e.g., Vpg, Vsl, and Vsrc, for controlling each operation of the pixels 100t to the pixel array 510 according to a control of a timing generator 530. The row driver 520 may perform a function of a voltage generator which may generate control voltages, e.g., Vpg, Vsl, and Vsrc. According to an example embodiment, the control voltages, e.g., Vpg, Vsl, and Vsrc, may be output from another voltage generator other than the row driver 520.

The timing controller 530 controls an operation of the row driver 520, the readout circuit 525, and the reference signal generator 560 according to a control of the control register block 550.

The readout circuit 525 includes an analog-to-digital converter by column and a memory 527 by column. According to an example embodiment, the analog-to-digital converter 526 may perform a function of correlated double sampling. The readout circuit 525 outputs a digital image signal corresponding to a pixel signal Vout output from each pixel.

When the pixel 100t is a pixel including the photogate transistor TR1 and the sensing transistor TR2 described referring to FIGS. 1 to 22, the photogate transistor TR1 included in the pixel 100t collects photo charges, e.g., holes h+ or electrons e−, based on the first gate voltage Vpg supplied to the first gate electrode, and the sensing transistor TR2 included in the pixel 100t changes a state of the sensing transistor TR2 based on the photo charges.

When the pixel 100t is a pixel including the photogate PG and the sensing transistor STR described referring to FIGS. 23 to 52, the photogate PG included in the pixel 100t collects optical charges, e.g., holes h+ or electrons e−, based on the first gate voltage Vpg supplied to the first gate electrode, and the sensing transistor STR included in the pixel 100t changes a state of the sensing transistor STR based on the optical charges.

As described above, a photogate structure may be the photogate transistor TR1 or the photogate PG.

A change in the state of the sensing transistor TR2 may be reflected to an output signal Vout. Here, the change in the state may be a change in the threshold voltage of the sensing transistor TR2 or a change in a current flowing through a channel of the sensing transistor TR2. The readout circuit 525 performs an analog-to-digital conversion on the output signal Vout.

A control register block 550 controls an operation of the timing controller 530, the reference signal generator 560, and the buffer 570 according to a control of a digital signal processor 600. The buffer 570 transfers image data IDATA corresponding to a plurality of digital image signals output from the readout circuit 525 to the digital signal processor 600.

The digital signal processor 600 includes an image signal processor 610, a sensor controller 620, and an interface 630. The image signal processor 610 controls the sensor controller 620 controlling a control register block 550, and an interface 630.

According to an example embodiment, the CMOS image sensor 505 and the digital signal processor 600 may be embodied in one package, e.g., a multi-chip package. According to another example embodiment, the CMOS image sensor 505 and the image signal processor 610 may be embodied in one package, e.g., a multi-chip package.

The image signal processor 610 processes image data IDATA transmitted from the buffer 570, and transmits the processed image data to the interface 630. The sensor controller 620 may generate various control signals for controlling the control register block 550 according to a control of the image signal processor 610. The interface 630 may transmit image data processed by the image signal processor 610 to a display 640.

The display 640 may display image data output from the interface 630. The display 640 may be embodied in a thin film transistor-liquid crystal display(TFT-LCD), a light emitting diode(LED) display, an organic LED(OLED) display, an active-matrix OLED(AMOLED), or a flexible display.

Figure 54:
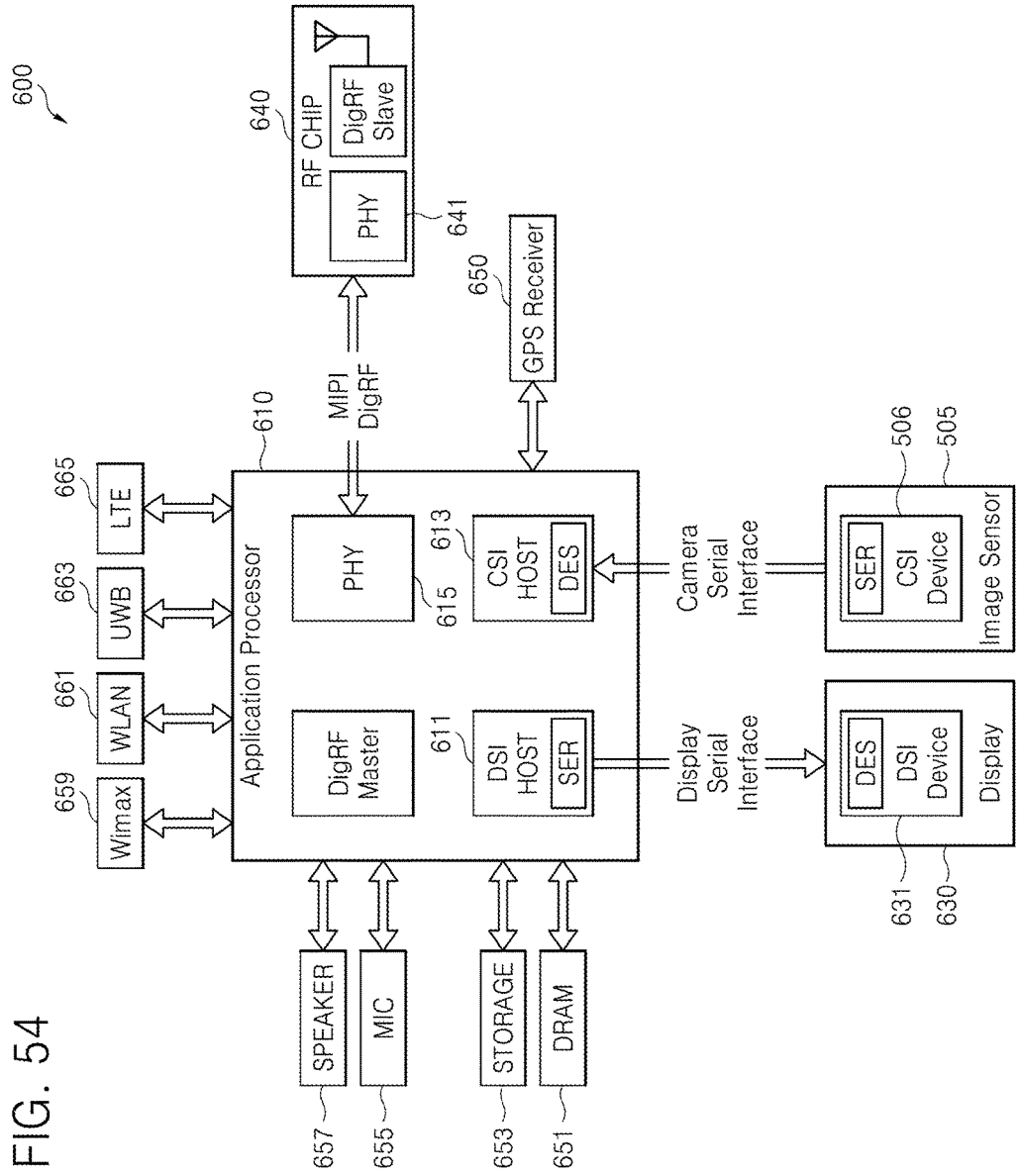
FIG. 54 is a block diagram depicting an example embodiment of the image processing system including the image sensor of FIG. 53.

FIG. 54 is a block diagram depicting an example embodiment of the image processing system including the image sensor of FIG. 53. Referring to FIGS. 53 and 54, the image processing system 600 may be embodied in a portable electronic device which may use or support a mobile industry processor interface(MIPI®).

The portable electronic device includes a processing circuit which may include a CMOS image sensor 505 and a processing circuit which may include image data IDATA output from the CMOS image sensor 505. The image processing system 600 includes an application processor (AP) 610, an image sensor 505, and a display 630.

A camera serial interface(CSI) host 613 embodied in the AP 610 may perform a serial communication with a CSI device 506 of the image sensor 505 through a camera serial interface(CSI). According to an example embodiment, a de-serializer DES may be embodied in the CSI host 613, and a serializer SER may be embodied in the CSI device 506.

A display serial interface(DSI) host 611 embodied in the AP 610 may perform a serial communication with the DSI device 631 of the display 630 through a display serial interface. According to an example embodiment, a serializer SER may be embodied in a DSI host 611, and a de-serializer DES may be embodied in a DSI device 631. Each of the de-serializer DES and the serializer SER may process an electrical signal or an optical signal.

The image processing system 600 may further include a radio frequency(RF) chip 640 which may communicate with the AP 610. A physical layer(PHY) 615 of the AP 610 and a PHY 641 of the RF chip 640 may transmit and receive data each other according to MIPI DigRF. The image processing system 600 may further include a GPS 650 receiver, a memory 651 like a dynamic random access memory (DRAM), a data storage device 653 embodied in a non-volatile memory like a NAND flash-based memory, a microphone 655, or a speaker 657.

The image processing system 600 may communicate with an external device using at least one communication protocol or communication standard, e.g., worldwide interoperability for microwave access(WiMAX) 659, Wireless LAN (WLAN) 661, ultra-wideband(UWB) 663, or long term evolution(LTE™) 665. The image processing system 600 may communicate with an external wireless communication device using Bluetooth or WiFi.

Figure 55:
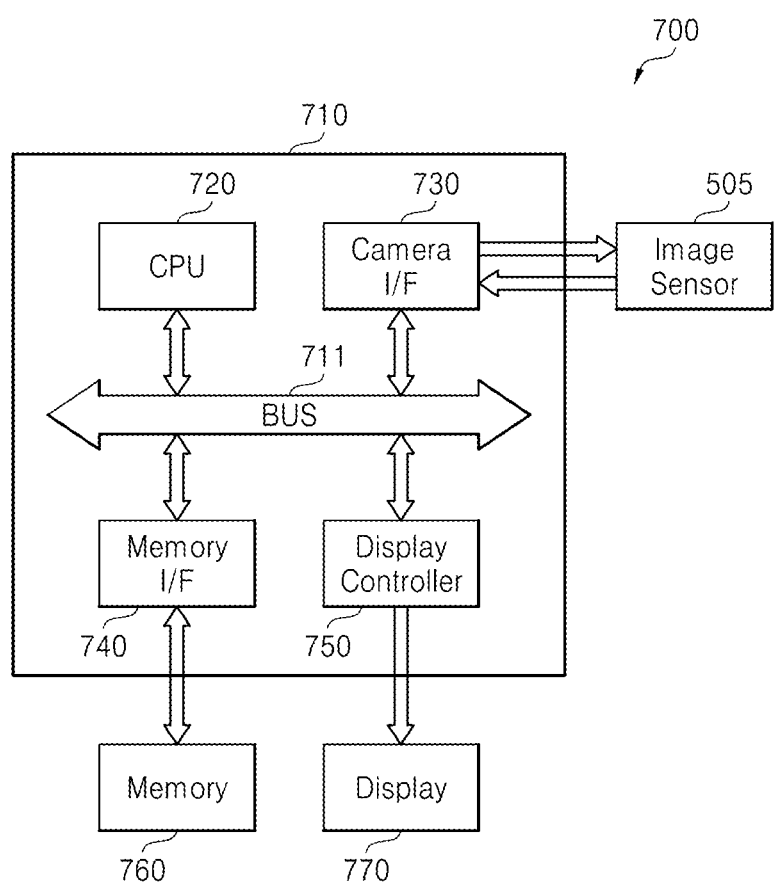
FIG. 55 is a block diagram depicting another example embodiment of the image processing system including the image sensor of FIG. 53.

According to an example embodiment, the AP 610 may further include each component 711, 720, 740, and 750 illustrated in FIG. 55.

FIG. 55 is a block diagram depicting another example embodiment of the image processing system including the image sensor of FIG. 53. Referring to FIGS. 53 and 55, an image processing system 700 may be embodied in a personal computer(PC) or a portable electronic device. The portable electronic device includes a CMOS image sensor 505 and a processing circuit which may include image data IDATA output from the CMOS image sensor 505 as described above.

The image processing system 700 may include an image sensor 505, a processor 710, a memory 760, and a display or display device 770. The image sensor 505 may be included in a camera module. The camera module may include mechanical components which may control an operation of the image sensor 505.

The processor 710 may be embodied in an integration circuit, a system on chip(SoC), an application processor, or a mobile application processor. The processor 710 may control an operation of the image sensor 505, the memory 760, and the display 770, process image data output from the image sensor 505, and store the processed image data in the memory 760 or display the processed image data through the display 770. The processor 710 includes a central processing unit(CPU) 720, a camera interface 730, a memory interface 740, and a display controller 750.

The CPU 720 may control operations of the camera interface 730, the memory interface 740, and the display controller 750 through a bus 711. The CPU 720 may be embodied in a multi-core processor or a multi-CPU. According to a control of the CPU 720, the camera interface 730 may transmit control signals for controlling the image sensor 505 to the image sensor 505, and transmit an image data signal output from the image sensor 505 to the CPU 720, the memory interface 740, and/or the display controller 750.

The memory interface 740 may interface data transmitted and received between the processor 710 and the memory 760. The display controller 750 may transfer data to be displayed on the display 770 to the display 770. The memory 760 may be a volatile memory like a DRAM or a flash-based memory. The flash-based memory may be embodied in a multimedia card(MMD), an embedded MMC(eMMC), an embedded solid state drive(eSSD) or a universal flash memory(UFS).

Figure 56:
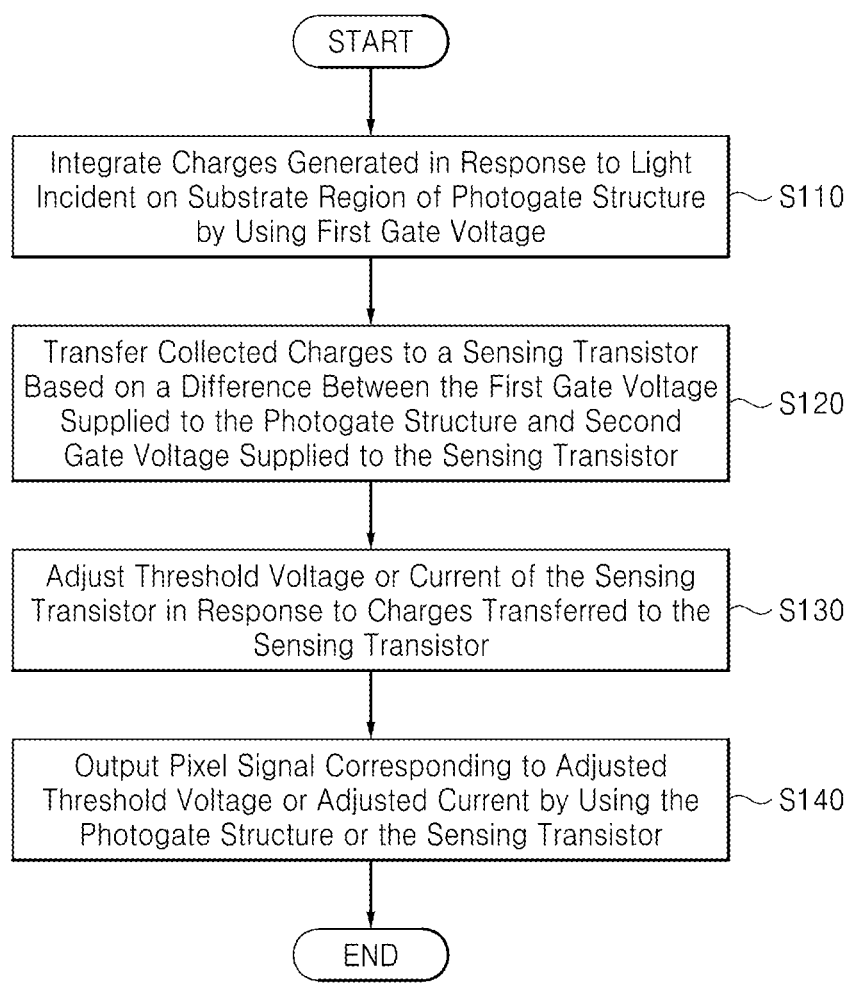
FIG. 56 is a flowchart for describing operation of an example embodiment of an image pixel.

FIG. 56 is a flowchart for describing an operation of an image pixel according to each embodiment of inventive concepts. Referring to FIGS. 1 to 56, a pixel 100t integrates charges, which are generated in response to light incident into a substrate region 111, 111-1, 211, or 211-1 included in the photogate structure TR1 or PG, to the upper of the substrate region 111, 111-1, 211, or 211-1 based on the first gate voltage Vpg supplied to the photogate structure TR1 or PG(S110).

The pixel 100t transfers the charges integrated in the photogate structure TR1 or PG to the sensing transistor TR2 or STR, e.g., a charge pocket region 119, 119-1, 119a, 119a-1, 119b, 119b-1, 213, or 213-1, based on a difference between the first gate voltage Vpg and the second gate voltage Vsl supplied to the sensing transistor TR2 or STR (S120).

The pixel 100t adjusts at least one of a threshold voltage of the sensing transistor TR2 or STR and a current flowing in the sensing transistor TR2 or STR in response to charges transmitted to the sensing transistor TR2 or STR(S130).

The pixel 100t outputs a pixel signal Vout corresponding to at least one of the adjusted threshold voltage and the adjusted current by using one of the photogate structure TR1 and the sensing transistor STR(S140). That is a change in the threshold voltage of the sensing transistor TR2 or STR and/or a change in a current flowing in the sensing transistor TR2 or STR may be reflected to the pixel signal Vout through the photogate structure TR1 or the sensing transistor STR.

CMOS image sensors according to example embodiments of inventive concepts includes two transistors sharing one shared region, so that the CMOS image sensor is advantageous to be made smaller. The pixel may ensure FSC and/or reduce kTC noises even while including two transistors. Image sensors according to example embodiments of inventive concepts include a photogate and one transistor, so that the image sensors are advantageous to be made smaller. The pixel may ensure FWC and/or reduce kTC noises even while including one transistor Although a few example embodiments of the inventive concepts have been shown and described, it will be appreciated by those skilled in the art that changes may be made in these example embodiments without departing from the principles and spirit of the inventive concepts, the scope of which is defined in the appended claims and their equivalents.

What is claimed is:

1. A complementary-metal-oxide-semiconductor (CMOS) image sensor comprising:
    a pixel array having a plurality of pixels, each of the plurality of pixels including,
        a photogate structure configured to be controlled based on a first gate voltage, and
        a sensing transistor including a charge pocket region formed in a substrate region, the sensing transistor being configured to be controlled based on a second gate voltage, wherein
        based on the first gate voltage, the photogate structure is configured to integrate charges generated in response to light incident on the substrate region, and
        the sensing transistor is configured to adjust at least one of a threshold voltage of the sensing transistor and a current flow in the sensing transistor according to charges transferred from the photogate structure to the charge pocket region based on a difference between the first gate voltage and the second gate voltage.

2. The CMOS image sensor of claim 1, further comprising:
    a readout circuit; wherein
        the photogate structure includes a photogate transistor having a drain and a source in the substrate region, the photogate transistor is configured to output a pixel signal corresponding to at least one of the adjusted threshold voltage and the adjusted current flow, and
        the readout circuit is configured to output a digital image signal based on the pixel signal.

3. The CMOS image sensor of claim 2, wherein the photogate transistor and the sensing transistor share one of the drain and the source, and wherein the photogate transistor and the sensing transistor are embodied in a planar structure.

4. The CMOS image sensor of claim 2, wherein the photogate transistor and the sensing transistor are embodied in a vertical structure and share one of the drain and the source.

5. The CMOS image sensor of claim 1, further comprising:
    a readout circuit; wherein
        the sensing transistor is configured to output a pixel signal corresponding to at least one of the adjusted threshold voltage and the adjusted current flow, and
        the readout circuit is configured to output a digital image signal based on the pixel signal.

6. The CMOS image sensor of claim 1, wherein the photogate structure and the sensing transistor are arranged in parallel.

7. The CMOS image sensor of claim 1, wherein the photogate structure includes a photodiode in the substrate region.

8. The CMOS image sensor of claim 1, wherein each pixel further includes a reset electrode configured to reset the pixel.

9. The CMOS image sensor of claim 1, wherein:
    the photogate structure includes,
        a first gate electrode configured to receive the first gate voltage,
        a first region in the substrate region, the first region being configured to output a pixel signal corresponding to at least one of the adjusted threshold voltage and the adjusted current flow, and
        a shared region in the substrate region, the photogate structure and the sensing transistor sharing the shared region; and
    the sensing transistor includes,
        a second gate electrode configured to receive the second gate voltage, and
        a second region in the substrate region, the charge pocket region being under the second gate electrode between the shared region and the second region.

10. The CMOS image sensor of claim 9, wherein the sensing transistor further includes a channel region on or over the charge pocket region in the substrate region.

11. The CMOS image sensor of claim 1, wherein:
    the photogate structure includes,
        a first gate electrode configured to receive the first gate voltage,
        a first region in the substrate region, the first region being configured to output a pixel signal corresponding to at least one of the adjusted threshold voltage and the adjusted current flow, and
        a shared region partially in the substrate region, the photogate structure and the sensing transistor sharing the shared region; and
    the sensing transistor includes,
        a second gate electrode configured to receive the second gate voltage, and a second region over the shared region, the charge pocket region being between the shared region and the second region.

12. The CMOS image sensor of claim 1, wherein:
the photogate structure includes,
a first gate electrode configured to receive the first gate voltage,
a first region on the substrate region, the first region being configured to output a pixel signal corresponding to at least one of the adjusted threshold voltage and the adjusted current flow, and
a shared region partially in the substrate region, the photogate structure and the sensing transistor sharing the shared region; and
the sensing transistor includes,
a second gate electrode configured to receive the second gate voltage, and
a second region over the shared region, the charge pocket region being between the shared region and the second region.

13. The CMOS image sensor of claim 1, wherein:
the photogate structure includes,
a first gate electrode on the substrate region, the first gate electrode being configured to receive the first gate voltage; and
the sensing transistor includes,
a second gate electrode configured to receive the second gate voltage,
a first region in the substrate region, the first region being configured to output a pixel signal corresponding to at least one of the adjusted threshold voltage and the adjusted current flow, and
a second region in the substrate region, the charge pocket region being under the second gate electrode and between the first region and the second region.

14. The CMOS image sensor of claim 13, wherein the photogate structure further includes a photodiode under the first gate electrode in the substrate region.

15. The CMOS image sensor of claim 1, wherein each pixel further includes a reset region in the substrate region, the reset region being connected to a reset electrode configured to reset the pixel.

16. The CMOS image sensor of claim 1, further comprising:
a row driver configured to,
set the first gate voltage to one of a ground voltage and a negative voltage, and
set the second gate voltage to the ground voltage to integrate the charges.

17. The CMOS image sensor of claim 1, wherein the first gate voltage is greater than the second gate voltage, and wherein the CMOS image sensor further includes,
a row driver configured to supply the first gate voltage to transfer the charges from the photogate structure to the charge pocket region.

18. The CMOS image sensor of claim 1, wherein the second gate voltage is greater than or equal to the first gate voltage, and the CMOS image sensor further includes,
a row driver configured to supply the second gate voltage, wherein
the photogate structure includes a photogate transistor having a drain and a source in the substrate region, and
the photogate transistor is configured to output a pixel signal corresponding to at least one of the adjusted threshold voltage and the adjusted current flow through one of the drain and the source.

19. The CMOS image sensor of claim 1, wherein the second gate voltage is less than or equal to the first gate voltage, and wherein the CMOS image sensor further includes,
a row driver configured to supply the second gate voltage, wherein
the sensing transistor is configured to output a pixel signal corresponding to at least one of the adjusted threshold voltage and the adjusted current flow.

20. An image processing system comprising:
a CMOS image sensor including a pixel array having a plurality of pixels; and
a processor configured to control an operation of the CMOS image sensor;
wherein each of the plurality of pixels includes,
a photogate structure configured to be controlled based on a first gate voltage, and
a sensing transistor including a charge pocket region in a substrate region, the sensing transistor being configured to be controlled based on a second gate voltage, wherein
based on the first gate voltage, the photogate structure is configured to integrate charges generated in response to light incident on the substrate region, and
the sensing transistor is configured to adjust at least one of a threshold voltage of the sensing transistor and a current flow in the sensing transistor according to charges transferred from the photogate structure to the charge pocket region based on a difference between the first gate voltage and the second gate voltage.

21. The image processing system of claim 20, further comprising:
a readout circuit; wherein
the photogate structure includes a photogate transistor having a drain and a source in the substrate region,
the photogate transistor is configured to output a pixel signal corresponding to at least one of the adjusted threshold voltage and the adjusted current flow, and
the readout circuit is configured to output a digital image signal corresponding to the pixel signal.

22. The image processing system of claim 20, further comprising:
a readout circuit; wherein
the sensing transistor is configured to output a pixel signal corresponding to at least one of the adjusted threshold voltage and the adjusted current flow, and
the readout circuit is configured to output a digital image signal corresponding to the pixel signal.

23. The image processing system of claim 20, wherein the CMOS image sensor and the processor are configured to communicate with each other using a MIPI camera serial interface (CSI).

24. A pixel of an image sensor, the pixel comprising:
a sensing transistor having a first gate electrode and including a charge pocket region, the first gate electrode being configured to receive a first gate voltage; and
a photogate transistor having a second gate electrode configured to receive a second gate voltage, the photogate transistor being configured to transfer accumulated charges to the charge pocket region based on a difference between the first gate voltage and the second gate voltage, the photocharges being accumulated in response to light incident on a substrate portion of the photogate transistor; wherein the sensing transistor and the photogate transistor share one of a source and a drain region.

25. The pixel of claim 24, wherein the charge pocket region is under the first gate electrode between a source region and a drain region of the sensing transistor.

26. The pixel of claim 24, wherein the sensing transistor is configured such that at least one of a threshold voltage of the sensing transistor and a current flow through the sensing transistor is adjusted according to the charges transferred from the photogate transistor to the charge pocket region.

27. The pixel of claim 24, wherein the photogate transistor and the sensing transistor are embodied in a vertical structure.

28. An image processing system comprising:
   a complementary-metal-oxide-semiconductor (CMOS) image sensor, the CMOS image sensor including a pixel array having a plurality of pixels, each of the plurality of pixels including,
   a sensing transistor having a first gate electrode and including a charge pocket region, the first gate electrode being configured to receive a first gate voltage, and
   a photogate transistor having a second gate electrode configured to receive a second gate voltage, the photogate transistor being configured to transfer accumulated charges to the charge pocket region based on a difference between the first gate voltage and the second gate voltage, the photocharges being accumulated in response to light incident on a substrate portion of the photogate transistor; wherein
   the sensing transistor and the photogate transistor share one of a source and a drain region; and
   a processor configured to control operation of the CMOS image sensor.

* * * * *